(12) United States Patent
Suehiro et al.

(10) Patent No.: US 7,391,153 B2
(45) Date of Patent: Jun. 24, 2008

(54) LIGHT EMITTING DEVICE PROVIDED WITH A SUBMOUNT ASSEMBLY FOR IMPROVED THERMAL DISSIPATION

(75) Inventors: Yoshinobu Suehiro, Aichi-ken (JP); Ryoichi Tohmon, Aichi-ken (JP); Satoshi Wada, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 5 days.

(21) Appl. No.: 10/891,422

(22) Filed: Jul. 15, 2004

(65) Prior Publication Data

US 2006/0012299 A1    Jan. 19, 2006

(30) Foreign Application Priority Data

| Jul. 17, 2003 | (JP) | ............................. 2003-276099 |
| Oct. 10, 2003 | (JP) | ............................. 2003-353007 |
| Oct. 17, 2003 | (JP) | ............................. 2003-358308 |

(51) Int. Cl.
*H05B 33/00* (2006.01)
*H05B 33/04* (2006.01)

(52) U.S. Cl. .......................... 313/512; 313/498; 257/98; 257/99; 257/100; 362/555; 362/800

(58) Field of Classification Search ......... 313/498–512, 313/501; 257/98–103; 362/555, 800
See application file for complete search history.

(56) References Cited

U.S. PATENT DOCUMENTS

| 3,596,136 | A | * | 7/1971 | Fischer ....................... 257/794 |
| 4,174,491 | A | * | 11/1979 | Nakamura et al. ........... 313/499 |
| 4,835,445 | A | * | 5/1989 | Watanabe et al. .............. 315/58 |
| 5,187,547 | A | * | 2/1993 | Niina et al. ................... 257/98 |
| 5,705,834 | A | * | 1/1998 | Egalon et al. ................. 257/98 |
| 6,340,824 | B1 | * | 1/2002 | Komoto et al. ................. 257/99 |
| 6,489,634 | B1 | | 12/2002 | Schaffer et al. |
| 6,498,355 | B1 | | 12/2002 | Harrah et al. |
| 6,561,680 | B1 | * | 5/2003 | Shih ........................... 362/294 |

(Continued)

FOREIGN PATENT DOCUMENTS

DE    196 38 667    2/1998

(Continued)

OTHER PUBLICATIONS

First Office Action from Chinese Patent Office issued on Sep. 29, 2006 for the corresponding Chinese patent application No. 200410071261.9 (a copy and English translation thereof).

(Continued)

*Primary Examiner*—Mariceli Santiago
(74) *Attorney, Agent, or Firm*—Posz Law Group, PLC

(57) ABSTRACT

A light emitting device has: a light emitting element; a lead that is electrically connected to the light emitting element at its one end and serves as a terminal to supply a power source to the light emitting element; a metal base that the light emitting element is mounted thereon and radiates heat of the light emitting element; and a sealing member that is of transparent resin or glass and covers the light emitting element. The lead is secured to the metal base by a heat-resisting insulating member with a thermal expansion coefficient nearly equal to that of the metal base.

28 Claims, 28 Drawing Sheets

U.S. PATENT DOCUMENTS

| | | | |
|---|---|---|---|
| 6,635,987 B1 * | 10/2003 | Wojnarowski et al. | 313/498 |
| 6,686,676 B2 * | 2/2004 | McNulty et al. | 313/112 |
| 2001/0000622 A1 * | 5/2001 | Reeh et al. | 257/98 |
| 2003/0142500 A1 | 7/2003 | Bachl et al. | |
| 2003/0189830 A1 | 10/2003 | Sugimoto et al. | |
| 2004/0004435 A1 * | 1/2004 | Hsu | 313/512 |
| 2004/0061433 A1 * | 4/2004 | Izuno et al. | 313/498 |
| 2004/0075100 A1 | 4/2004 | Bogner et al. | |
| 2004/0169451 A1 | 9/2004 | Oishi et al. | |

FOREIGN PATENT DOCUMENTS

| | | | |
|---|---|---|---|
| EP | 0-477-801 A1 | | 9/1991 |
| JP | 60136274 A | * | 7/1985 |
| JP | A-64-65881 | | 3/1989 |
| JP | 02240975 A | * | 9/1990 |
| JP | 04343277 A | * | 11/1992 |
| JP | 06244458 A | * | 9/1994 |
| JP | 07307489 A | * | 11/1995 |
| JP | 11-186596 | | 7/1999 |
| JP | 11186596 A | * | 7/1999 |
| JP | A-11-177129 | | 7/1999 |
| JP | A-11-204838 | | 7/1999 |
| JP | A-2000-150967 | | 5/2000 |
| JP | A-2000-1540967 | | 5/2000 |
| JP | 2005129896 A | * | 5/2005 |

OTHER PUBLICATIONS

Office Action issued from German Patent Office on Aug. 11, 2005 for the corresponding German patent application No. 10 2004 034 166. 4-33 (a copy and English translation thereof).

Official Letter and its English Translation issued on Apr. 16, 2007 in corresponding German Application No. 10 2004 063978.7-33.

* cited by examiner

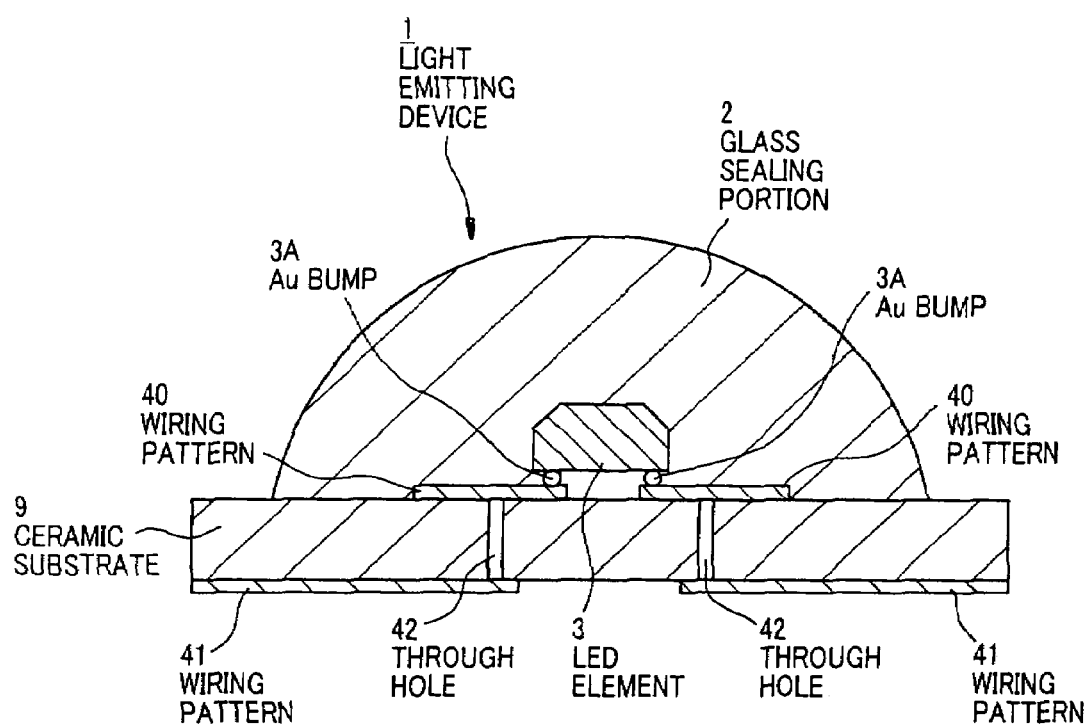

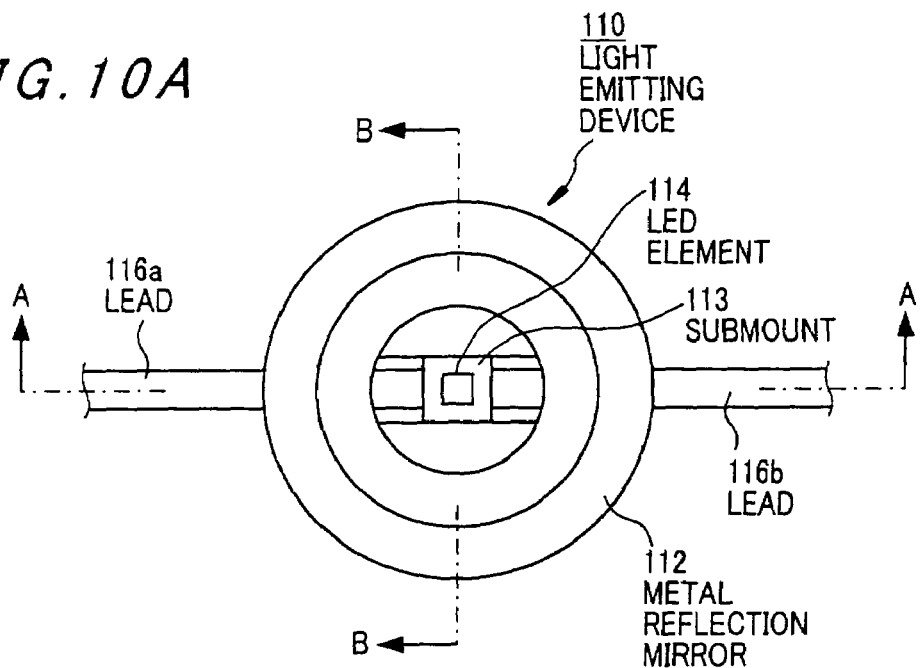
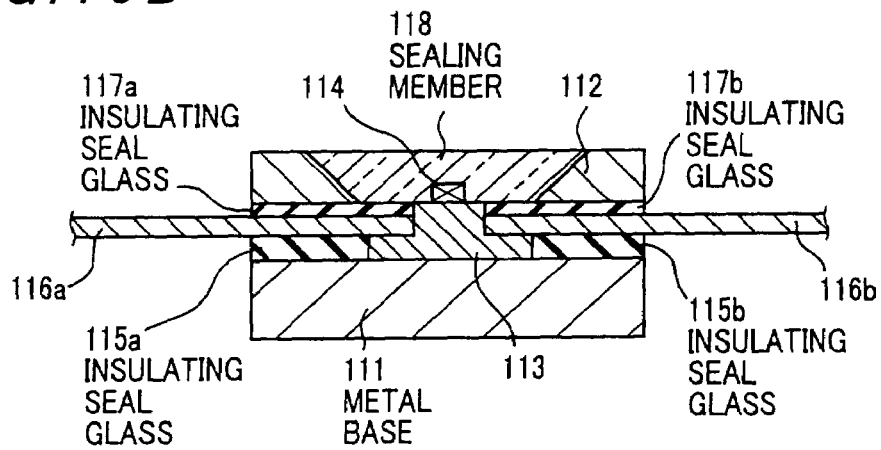
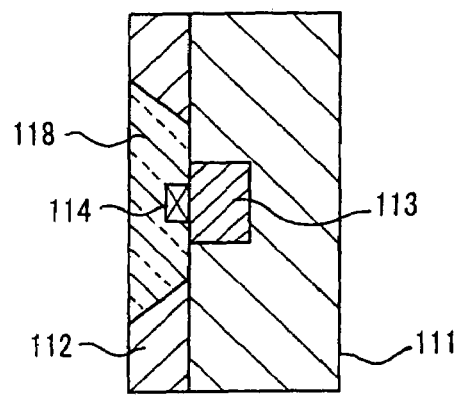

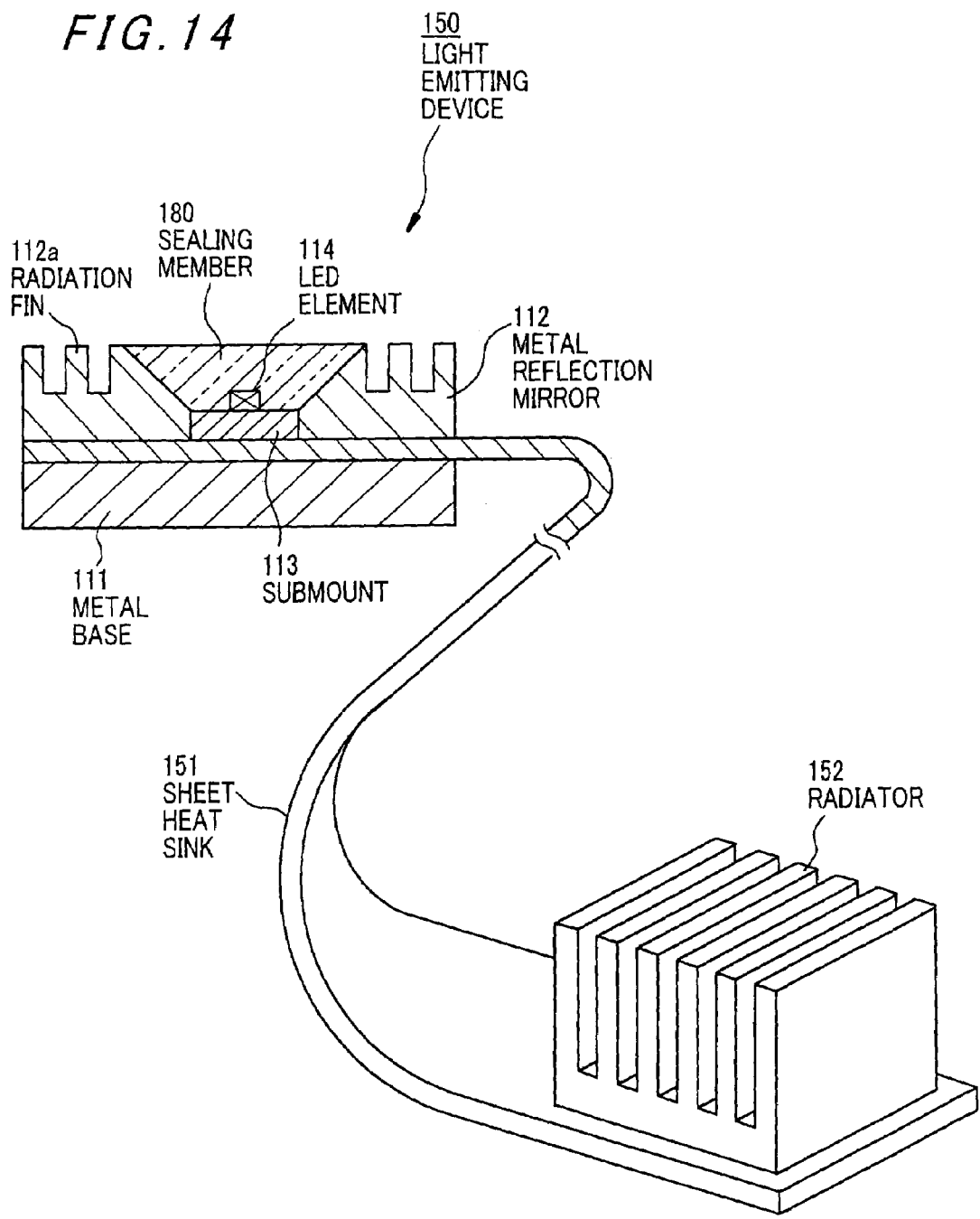

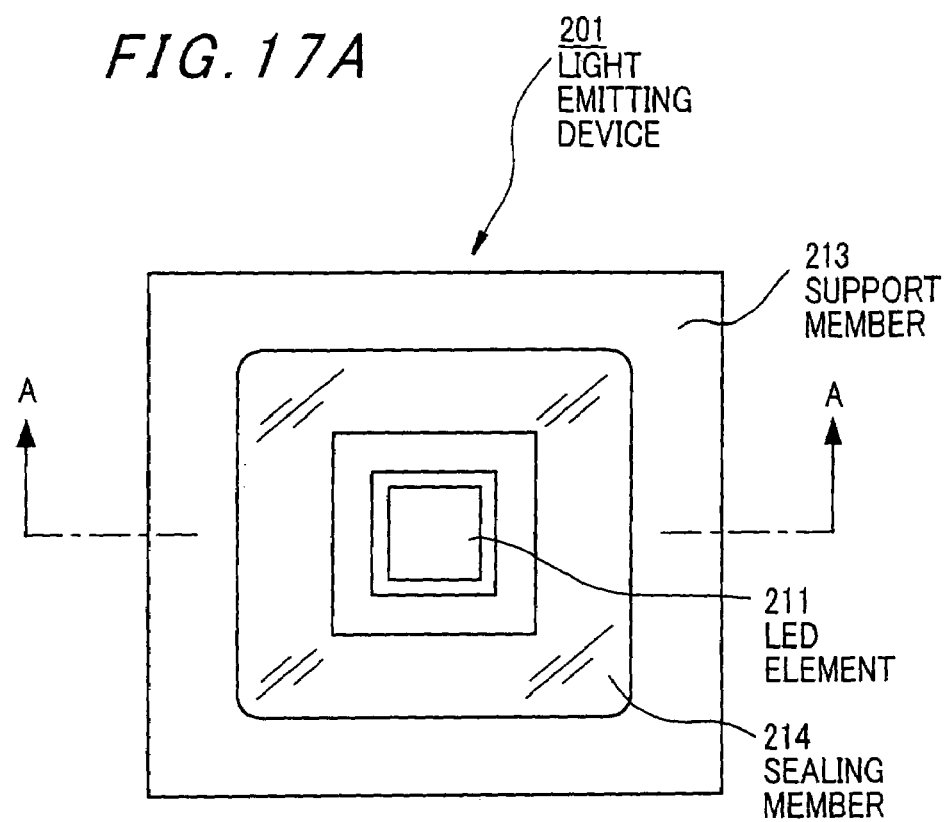
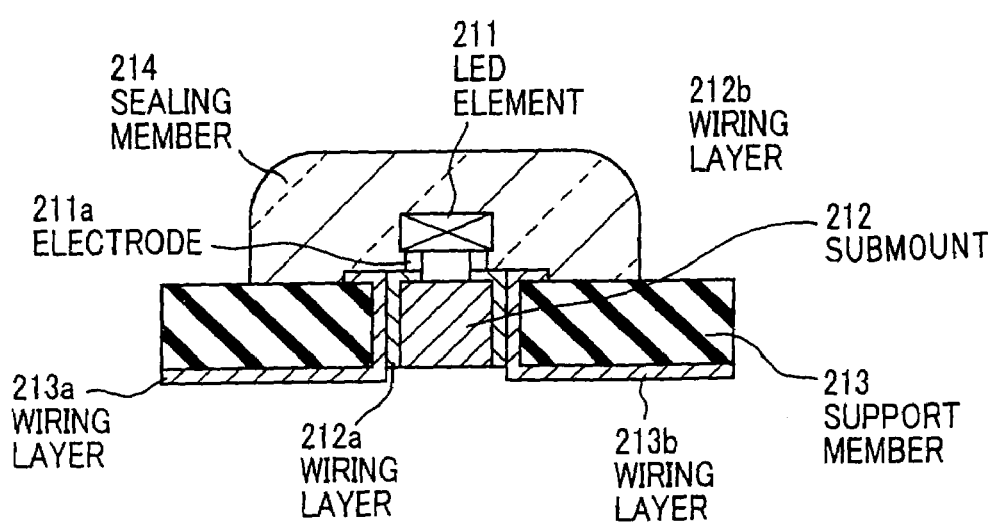

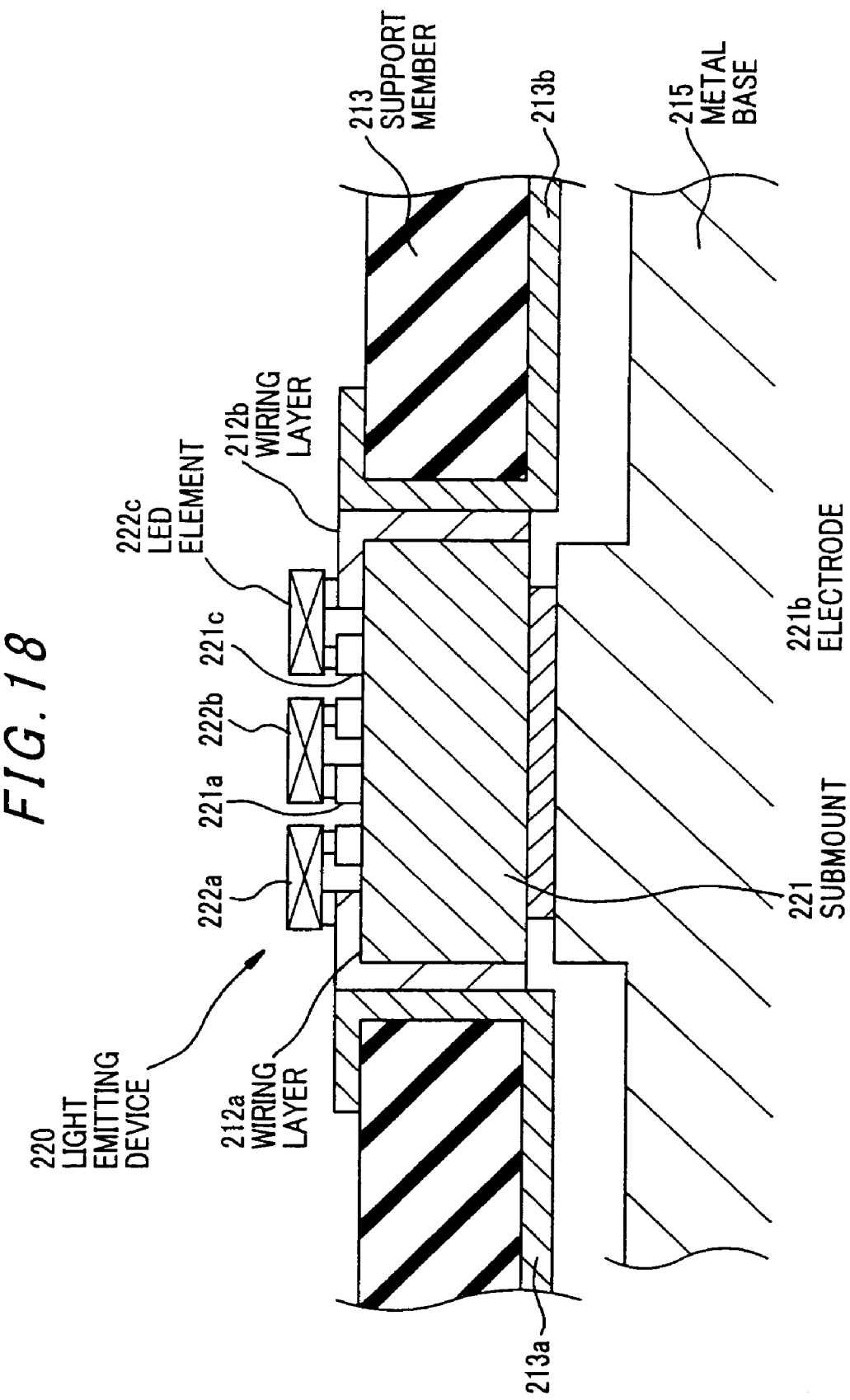

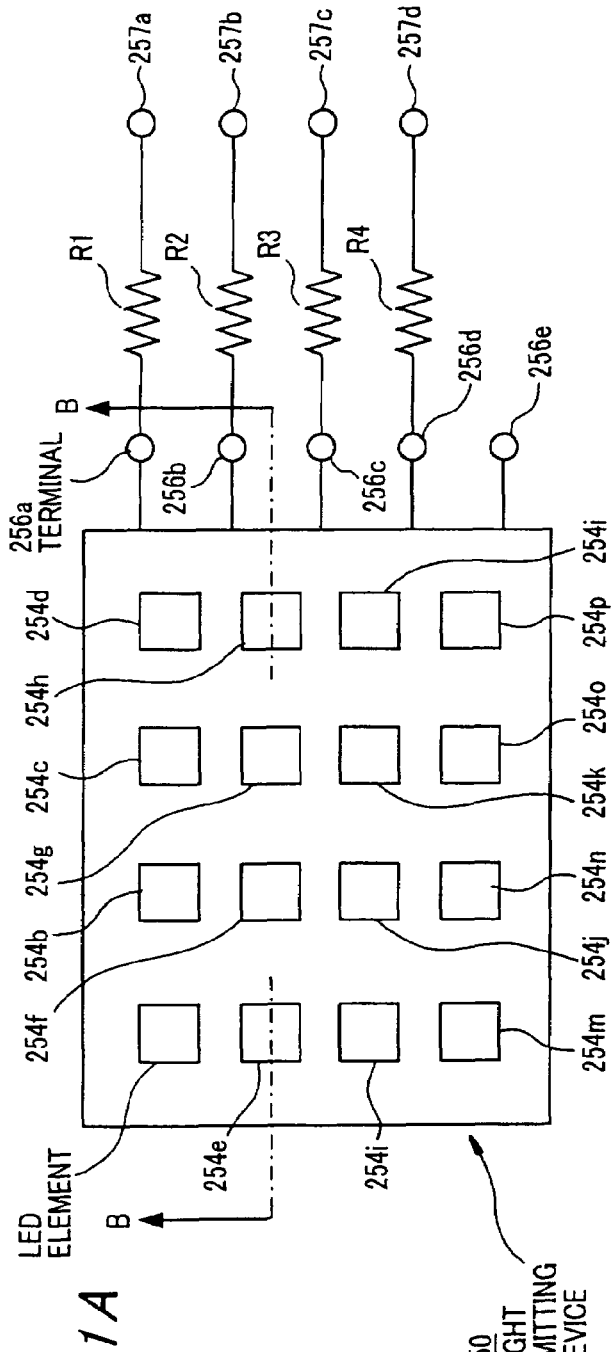
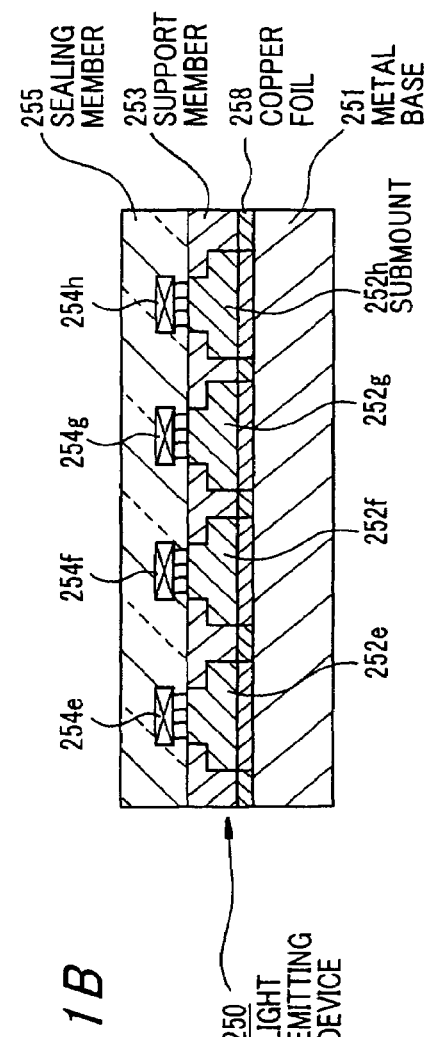
FIG.21A
FIG.21B

LIGHT EMITTING DEVICE PROVIDED WITH A SUBMOUNT ASSEMBLY FOR IMPROVED THERMAL DISSIPATION

The present application is based on Japanese patent applications Nos. 2003-276099, 2003-353007 and 2003-358308, the entire contents of which are incorporated herein by reference.

BACKGROUND OF THE INVENTION

1. Field of the Invention

This invention relates to a light emitting device that a light emitting diode (hereinafter referred to as LED) as a light source is sealed with a moisture-impermeable material such as glass.

Also, this invention relates to a light emitting device that heat generated from a high-output light emitting element can be effectively radiated.

2. Description of the Related Art

Conventionally, light emitting devices using LED as a light source are known. An example thereof is a light emitting device that an LED element is integrally sealed with sealing resin such as epoxy resin.

The epoxy resin is widely available and is easy to mold. Therefore, it is widely used as a sealing material for light emitting device. However, the epoxy resin is gradually colored and turns yellow when it is irradiated by intensive light emitted from the LED element. If it is thus colored, the light output of the light emitting device must be reduced because light emitted from the LED element is absorbed by the colored portion.

Japanese patent application laid-open No. 11-204838 (herein referred to as prior art 1) discloses a light emitting device that an LED element is sealed with a moisture-impermeable glass layer with phosphors contained therein.

FIG. 1 is a cross sectional view showing the light emitting device disclosed in prior art 1. The light emitting device 50 is composed of: wiring conductors 51, 52; a cup portion 53 formed in the wiring conductor 52; the LED element 54 bonded at a bottom 53A of the cup portion 53; wires 55, 55 that each electrically connect between the electrode of LED element and the wiring conductors 51, 52; a glass layer 56 that seals the LED element 54 disposed inside the cup portion 53; phosphors 56A contained in the glass layer 56; a lamp-shaped sealing resin 57 that is transparent and seals all the above elements.

In this structure, since the LED element 54 is sealed with the glass layer 56 filled in the cup portion 53, the reduction of light output due to colored sealing material can be avoided. Further, the degradation of phosphor can be prevented because the glass layer blocks the permeation of moisture.

However, the light emitting device of prior art 1 has the next problems:

(1) Since the viscosity of glass layer is significantly greater than that of resin, air bubbles must be contained in the glass layer in sealing the LED element with the glass material. The air bubbles once contained therein are difficult to separate. Therefore, the air bubbles will remain in the glass layer.

(2) In sealing the LED element with glass, it is processed at a high temperature of 300° C. or higher. After the processing, the residual stress in the glass material is generated due to a difference in thermal expansion coefficient between the LED element and the glass material. The residual stress may cause a crack in the glass material when being subjected to a heat shock.

In recent years, high-output LED's are developed and a large output type LED at several watts output level is already manufactured. Although LED's are characterized by small heat release, the high-output (high-brightness) LED element must generate a considerable amount of heat because of a large current flow passed therethrough.

Japanese patent application laid-open No. 2000-150967 (herein referred to as prior art 2) discloses an LED package that a slug as heat sink is disposed below an LED element (LED die).

In the LED package of prior art 2, the slug is inserted to a lead frame over-molded with an embedded plastic member. The LED die is attached directly or indirectly to the slug through a sub-base that has a good thermal conductivity.

In this structure, since the LED die is thermally connected to the slug, the LED die can be kept at a bonding temperature lower than that of conventional packages. Because of being at the lower temperature, the LED die may be not subjected to a large thermal stress and, therefore, reliability and good characteristics thereof can be secured even at large power operation.

However, the LED package of prior art 2 has the next problems:

(1) The secondary support member (embedded plastic member) to over-mold the lead frame is required. Therefore, the number of parts must be increased and it is difficult to provide a compact package.

(2) Further, since the secondary support member is made of resin, the LED package does not have such a high heat resistance that it can be applied to the lead-free reflowing.

SUMMARY OF THE INVENTION

It is an object of the invention to provide a light emitting device that allows the lowing of residual bubble and the reducing of internal stress in its sealing material.

It is a further object of the invention to provide a light emitting device that allows the effective dissipation of heat from a high-output light emitting element while having a sufficient heat resistance.

According to the first aspect of the invention, a light emitting device comprises:

a light emitting element that emits light with a predetermined wavelength; and a sealing portion that seals the light emitting element, wherein the light emitting element is provided with a stress reducing portion that reduces an internal stress in the sealing portion.

In this composition, after the light emitting element is sealed with a sealing material, a crush due to the local concentration of internal stress in the sealing portion can be prevented.

The stress reducing portion may be formed by obliquely cutting the corner of light emitting element.

In the light emitting device thus composed, since the shape of LED element is designed to reduce the concentration of internal stress in the sealing portion, the decreasing of residual bubbles and the reduction of internal stress can be attained.

According to the second aspect of the invention, a light emitting device comprises:

a light emitting element;

a lead that is electrically connected to the light emitting element at its one end and serves as a terminal to supply a power source to the light emitting element;

a metal base that the light emitting element is mounted thereon and radiates heat of the light emitting element; and a sealing member that is of transparent resin or glass and covers the light emitting element, wherein the lead is secured to the metal base by a heat-resisting insulating member with a thermal expansion coefficient nearly equal to that of the metal base.

A submount is preferably provided that makes a connection to the light emitting element and the lead through an electrode or wiring layer. The light emitting element is preferably mounted through the submount on the metal base. A metal reflection mirror portion may be stacked on the metal base or integrated with the metal base.

In the light emitting device thus composed, by mounting the submount on the metal base and attaching the metal reflection mirror to the metal base, a high radiation efficiency can be obtained since heat generated from the light emitting element is conducted by the metal base and the metal reflection mirror. Thus, it can be applied to a high-output type light emitting element. Further, since a support member of heat-resisting insulating material is used, it can be applied to the reflowing using a lead free solder.

According to the third aspect of the invention, a light emitting device comprises:

an optical element;

a submount that the optical element is mounted thereon and has a thermal expansion coefficient nearly equal to that of the optical element;

a support member that is provided with a hole into which the submount is inserted, and has a thermal expansion coefficient greater than that of the submount; and a transparent sealing member that seals the optical element and is transparent to a targeted wavelength, wherein the submount is disposed such that its surface to mount the optical element is exposed from the hole on the side of the sealing member, and is bonded to the support member and the transparent sealing member to seal the optical element.

In the light emitting device thus composed, by equalizing the thermal expansion coefficient of optical element and submount, the stress due to temperature difference between the optical element and the submount can be reduced. Therefore, the stress damage to optical element can be prevented that is caused by process temperature in device fabrication, atmosphere temperature of reflow oven or heat in operation of optical element. Further, by equalizing the thermal expansion coefficient of support member and sealing member, inserting the submount into the penetrating hole of support member, and providing the surface of submount with an area nearly equal to that of LED element, the stress caused by a temperature difference between the high-temperature state and low-temperature state of glass processing can be reduced in the wide and long contact region between the support member and sealing member so as to prevent a boundary separation or cracking. Thereby, the glass sealing can be realized for light emitting device. Thus, the weather resistance to a targeted wavelength and the heat resistance can be secured while providing a compact package.

BRIEF DESCRIPTION OF THE DRAWINGS

The preferred embodiments according to the invention will be explained below referring to the drawings, wherein:

FIG. 7 is a cross sectional view showing the central portion of a light emitting device in a fourth preferred embodiment of the invention;

FIG. 10A is a plain view showing a light emitting device in a seventh preferred embodiment of the invention;

FIG. 10B is a cross sectional view cut along a line A-A in FIG. 10A;

FIG. 10C is a cross sectional view cut along a line B-B in FIG. 10A;

FIG. 14 shows a light emitting device in an eleventh preferred embodiment of the invention;

FIG. 17A is a plain view showing a light emitting device in a thirteenth embodiment of the invention;

FIG. 17B is a cross sectional view cut along a line A-A in FIG. 17A;

FIG. 18 is a cross sectional view showing a modification of a support member in the light emitting device in the thirteenth embodiment;

FIG. 21A is a plain view showing a light emitting device in a fifteenth preferred embodiment of the invention;

FIG. 21B is a cross sectional view cut along a line B-B in FIG. 21A;

DETAILED DESCRIPTION OF THE PREFERRED EMBODIMENTS

Figure 1:
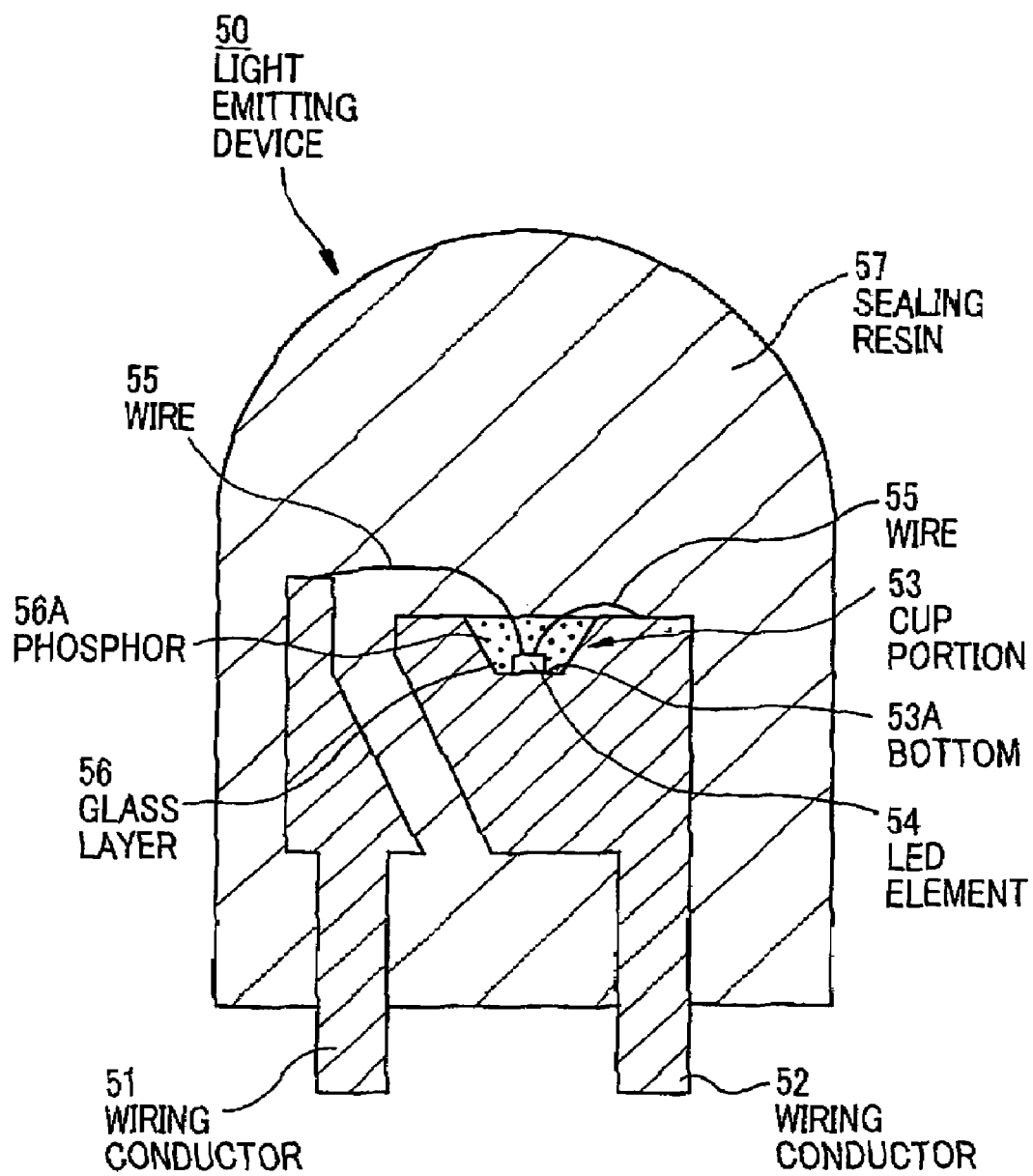
FIG. 1 is a cross sectional view showing the light emitting device disclosed in prior art 1.
Figure 2A:
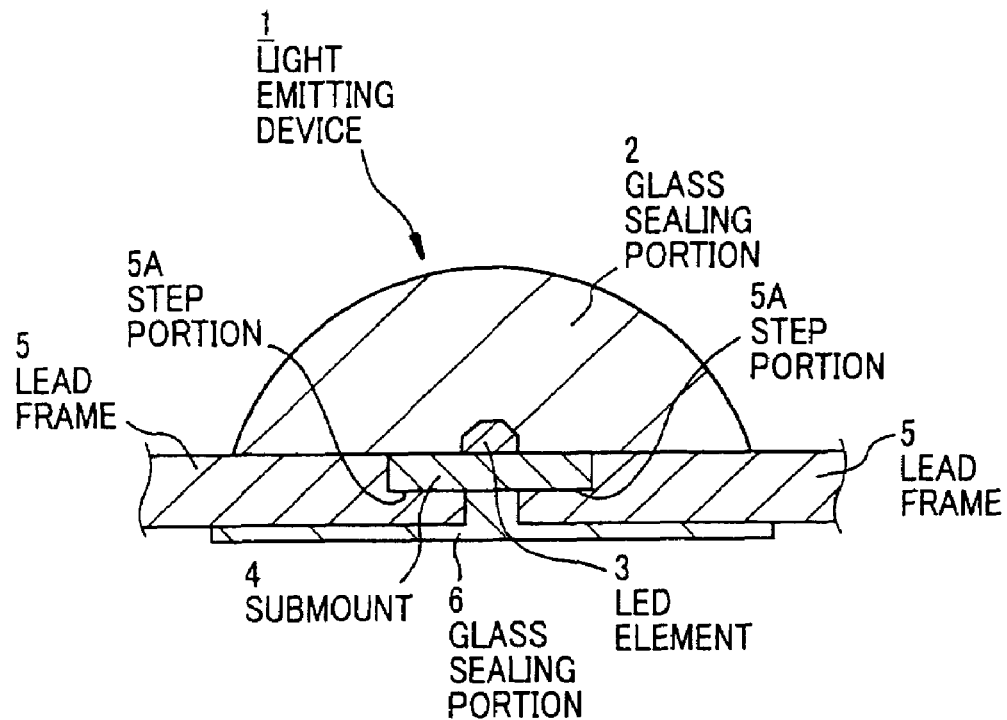
FIG. 2A is a cross sectional view showing the central portion of a light emitting device in a first preferred embodiment of the invention.
Figure 2B:
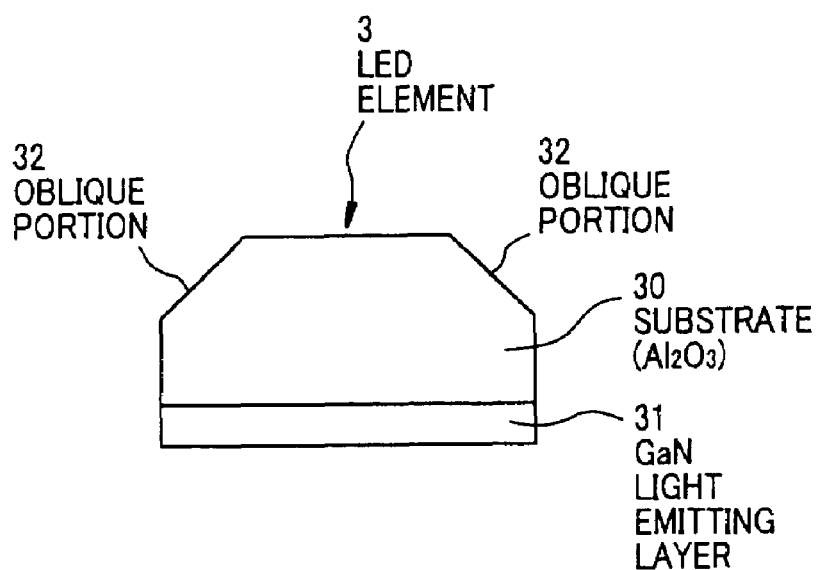
FIG. 2B is an enlarged side view showing an LED element in FIG. 2A.

FIG. 2A is a cross sectional view showing the central portion of a light emitting device in the first preferred embodiment of the invention. FIG. 2B is an enlarged side view showing an LED element in FIG. 2A.

The light emitting device 1 is, as shown in FIG. 2A, composed of: a glass sealing portion 2 that is of transparent glass material; an LED element 3 that emits light with a predetermined wavelength; a submount 4 that mounts the LED element 3; a lead frame 5 that is a wiring conductor to supply power to the LED element 3; and a glass sealing portion 6 that protects the lower surface of lead frame 5.

The glass sealing portion 2 is of low-melting glass with a refractive index of n=1.5 and with a thermal expansion coefficient of $16 \times 10^{-6}$. The glass sealing portion 2 is molded into a dome-like optical form according to a desired light distribution characteristic by hot pressing, and it is fused and bonded onto the lead frame 5 to seal the LED element 3. Meanwhile, the glass sealing portion 2 may be not provided with the optical form according to the desired light distribution characteristic.

The LED element 3 is, as shown in FIG. 2B, a flip-chip type light emitting element that has a GaN light-emitting layer 31 formed on a substrate 30 of $Al_2O_3$. It has a thermal expansion coefficient of $7 \times 10^{-6}$ and an emission wavelength of 380 nm. The LED element 3 has oblique portions 32 that are obliquely cut off at (four) corners on the emission observing surface side. Its electrodes (not shown) are electrically connected through an Au bump (not shown) to a wiring pattern formed on the submount 4. The size of LED element 3 is 0.32×0.32 mm.

The submount 4 is of $Al_2O_3$ and has a thermal expansion coefficient of $13 \times 10^{-6}$. On its surface, a wiring pattern (not shown) of copper foil is formed. The wiring pattern is electrically connected to the electrodes of LED element 3 and is solder-bonded to the lead frame 5.

The lead frame 5 is of copper or copper alloy and has a thermal expansion coefficient of $16 \times 10^{-6}$ and Au plating formed on the surface. Its tip portion bonded to the submount 4 is provided with a step portion 5A according to the thickness of submount 4 such that the upper surface of submount 4 solder-bonded to the step portion 5A defines a nearly even surface in connection with the upper surface of lead frame 5. The lead frame 5 may be of another material (e.g., iron alloys) other than copper if its conductivity satisfies a desired characteristic.

The glass sealing portion 6 is of the same low-melting glass as the glass sealing portion 2, and is integrated with the glass sealing portion 2 by the hot pressing to protect the lower surface of lead frame 5.

Figure 3:
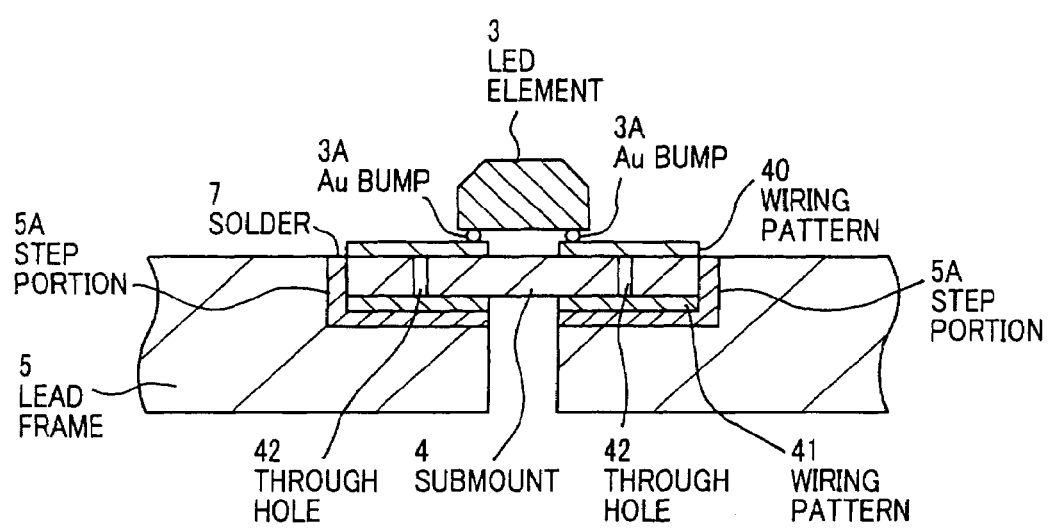
FIG. 3 is an enlarged cross sectional view showing the LED element in FIG. 2A and its vicinity.

FIG. 3 is an enlarged cross sectional view showing the LED element in FIG. 2A and its vicinity.

The submount 4 is composed of: a wiring pattern 40 formed on the mount side of LED element 3; a wiring pattern 41 formed on the joint side of lead frame 5; and through holes 42 that electrically connect between the wiring patterns 40 and 41 while penetrating the submount 4. The wiring pattern 41 is electrically connected through a solder 7 provided between the wiring pattern 41 and the step portion 5A to the lead frame 5. The wiring pattern 40 is electrically connected through the Au bump 3A to the electrode (not shown) of LED element 3.

Figure 4:
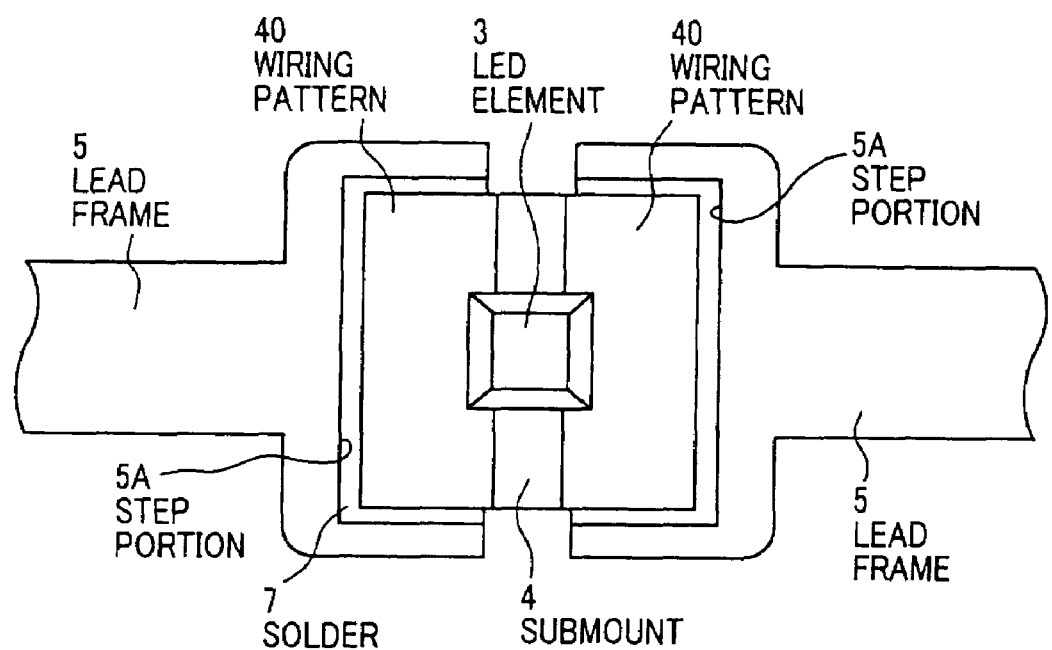
FIG. 4 is a top view showing the LED element and the vicinity in FIG. 3 viewed from the top (emission observing surface side)

FIG. 4 is a top view showing the LED element and the vicinity in FIG. 3 viewed from the top (emission observing surface side).

The LED element 3 is mounted on the center of submount 4 that is in the form of a square. The wiring pattern formed on the submount 4 has an excellent adhesion property to the glass member, and thereby the glass sealing property can be enhanced around the LED element 3. The wiring pattern 40 is not limited to the pattern as shown and may be such a pattern that the exposed portion of submount 4 can be reduced.

In manufacturing the light emitting device 1, at first, the lead frame 5 is made by pressing and stamping a strip material of copper alloy. Then, the submount 4 is positioned to the step portion 5A of lead frame 5. Then, the wiring pattern 41 of the submount 4 is bonded to the lead frame 5 through the solder 7. Then, the electrode of LED element 3 is positioned to the wiring pattern 40 of the submount 4. Then, the electrode of LED element 3 is electrically connected through the Au bump 3A to the wiring pattern 40 of the submount 4. Then, the plate-like low-melting glass is disposed on and under the lead frame 5. Then, the low-melting glass is bonded to the upper and lower surfaces of lead frame 5 while molding the glass by hot pressing at a temperature not to give a thermal damage to the LED element 3, under reduced pressure in a nitrogen ($N_2$) atmosphere. Thereby, the softened low-melting glass is closely bonded to the surface of LED element 3, submount 4 and lead frame 5. Thus, the glass sealing portions 2 and 6 are integrated to make a predetermined shape, and excessive glass is removed to shape the light emitting device 1. Then, the light emitting device 1 is cut off from the lead frame 5.

In the first embodiment, since the corners of LED element 3 are obliquely cut off to offer the oblique portions 32, the turbulence of glass can be reduced when integrally molding the low-melting glass being softened at about $10^8$ to $10^{10}$ poises. Thereby, the uniformity of glass can be maintained and the inclusion of air can be prevented. Therefore, the light emitting device 1 with reduced residual bubble can be obtained. Further, because of cutting off the acute corner that the internal stress is likely to concentrate, the occurrence of crack by a heat shock in the glass sealing portion 2 can be prevented. The cutting is easily conducted by using a suitable cutter in the wafer dicing.

Although in the first embodiment the LED element 3 is provided with the oblique portions 32 at the four corners on the emission observing surface side, edges defined between the emission observing surface and the side face of LED element 3 may be also cut off. Thereby, the residual bubble around the LED element 3 can be further reduced (enhancing the uniformity of glass), and the occurrence of crack can be further prevented.

Although in the first embodiment the glass sealing portion 2 is of transparent low-melting glass, it may be colored.

In bonding the submount 4, silver solder that does not melt at the temperature for processing the low-melting glass may be used instead of the solder 7. The LED element 3 may be mounted on the submount 4 after the submount 4 is bonded to the lead frame 5.

Figure 5:
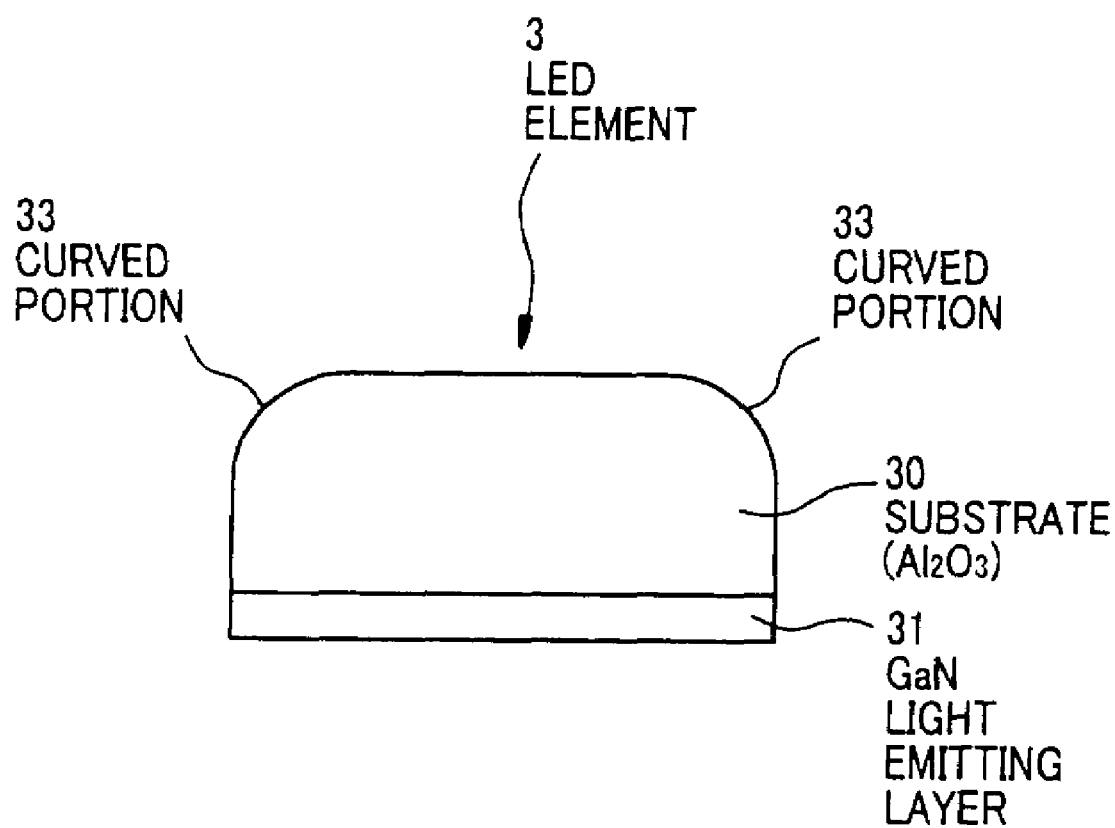
FIG. 5 is a side view showing an LED element in a second preferred embodiment of the invention.

FIG. 5 is a side view showing an LED element in the second preferred embodiment of the invention.

The LED element 3 is structured such that the four corners on the emission observing surface side are rounded to offer curved portions 33 instead of cutting off the corners.

In the second embodiment, because of having the curved portions at the corners, the turbulence of glass can be more effectively reduced when integrally molding the softened low-melting glass by hot pressing. Thereby, the residual bubble around the LED element 3 can be further reduced (enhancing the uniformity of glass), and the occurrence of crack can be further prevented.

In addition to the curved portions 33 at the four corners on the emission observing surface side, edges defined between the emission observing surface and the side face of LED element 3 may be also cut off. Thereby, the residual bubble around the LED element 3 can be further reduced (enhancing the uniformity of glass), and the occurrence of crack can be further prevented.

Figure 6:
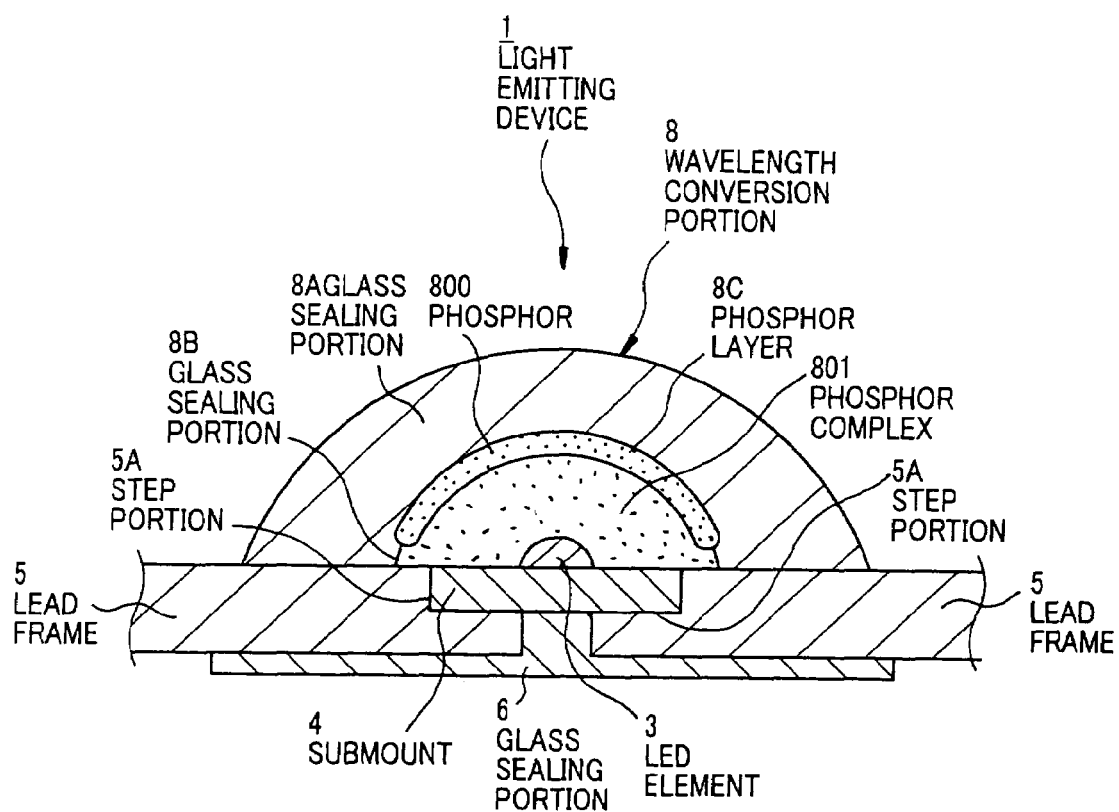
FIG. 6 is a cross sectional view showing the central portion of a light emitting device in a third preferred embodiment of the invention.

FIG. 6 is a cross sectional view showing the central portion of a light emitting device in the third preferred embodiment of the invention.

The light emitting device 1 is constructed as a wavelength conversion device composed of, instead of the glass sealing portion 2 in the first embodiment, a wavelength conversion portion 8 that includes: a transparent glass sealing portion 8A; a glass sealing portion 8A containing phosphor complexes 801; and a phosphor layer 8C of phosphors 800 disposed between the glass sealing portions 8A and 8B.

The glass sealing portion 8B is of phosphor complex containing glass that erbium ($Er^{3+}$) is included as the phosphor complex 801. The phosphor complex 801 is excited by light emitted from the LED element 3, thereby emitting excited light.

The thin-film phosphor layer 8C is formed such that it is screen-printed on low-melting glass composing the glass sealing portion 8A, and then is dried by heating.

The wavelength conversion portion 8 is fabricated as described below.

(1) Process of Forming Phosphor Layer

At first, a glass sheet of low-melting glass is provided. The glass sheet preferably has such a length that a plurality of LED elements 3 can be arranged in the longitudinal direction. Then, the phosphor solution is prepared by dissolving phosphor 800 into n-butyl acetate containing about 1% nitrocellulose as a viscosity improver. The solution is screen-printed on the surface of a glass sheet at corresponding pitches to intervals for arranging the LED element 3, thereby providing a thin film attached thereon. Then, the glass sheet with the phosphor solution printed thereon is heated to remove the solvent portion, thereby obtaining the phosphor layer 8C. The heating is preferably conducted under reduced pressure.

(2) Process of Forming Complex Glass

Then, a phosphor complex glass sheet containing $Er^{3+}$ is provided, and it is disposed on the glass sheet with phosphor layer prepared by the process of forming phosphor layer while sandwiching the phosphor layer 8C. Although the glass sheet with phosphor layer 8C preferably has the same shape as the phosphor complex glass sheet, they may have a different shape from each other. Then, the glass sheet with phosphor layer 8C and the phosphor complex glass sheet are fused and bonded by hot pressing under reduced pressure. The phosphor layer 8C is provided such that it is located at the boundary of the two glass sheets bonded.

The composite glass thus formed is then integrated with the LED element 3 and the lead frame 5 by hot pressing. The phosphor layer 8C is deformed along the shape of LED element 3, and it is located at a certain distance from the LED element 3.

The third embodiment, in addition to the effects of the first embodiment, has the effects that the thickness of phosphor layer 8C and the distance form the LED element 3 can be kept constant, and thereby the light emitting device 1 can have a good wavelength conversion property based on excited light to be radiated from the glass sealing portion 8B by excitation of phosphor complex. Although in this embodiment the wavelength conversion potion 8 includes both the phosphor complex contained glass and the phosphor layer, it may include either of the phosphor complex contained glass and the phosphor layer.

FIG. 7 is a cross sectional view showing the central portion of a light emitting device in the fourth preferred embodiment of the invention.

The light emitting device 1 uses a ceramic substrate 9 instead of the lead frame 5 as described in the first embodiment.

The ceramic substrate 9 is composed of: a wiring pattern 40 formed on the mount side of LED element 3; a wiring pattern 41 formed through the ceramic substrate 9 on the opposite side of the wiring pattern 40; and through holes 42 that electrically connect between the wiring patterns 40 and 41 while penetrating the ceramic substrate 9. The wiring pattern 40 is electrically connected through the Au bump 3A to the electrode (not shown) of LED element 3.

In the fourth embodiment, the LED element 3 as described in the first embodiment is mounted on the ceramic substrate 9. Therefore, the light emitting device 1 can be fabricated at a higher density as compared to the case of using the lead frame 5. Thus, it can have a good productivity and the fabrication cost can be reduced. Further, the light emitting device 1 thus structured has a feature that the occurrence of crack in the glass portion can be reduced even when being separated by dicing etc.

Figure 8A:
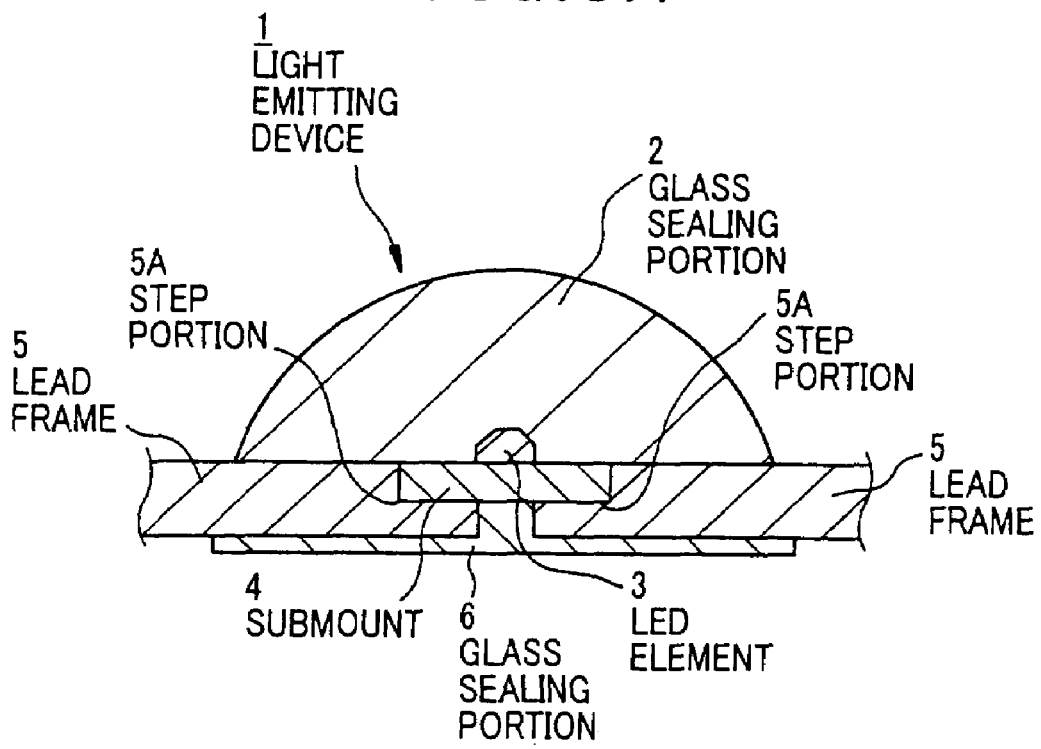
FIG. 8A is a cross sectional view showing the central portion of a light emitting device in a fifth preferred embodiment of the invention.
Figure 8B:
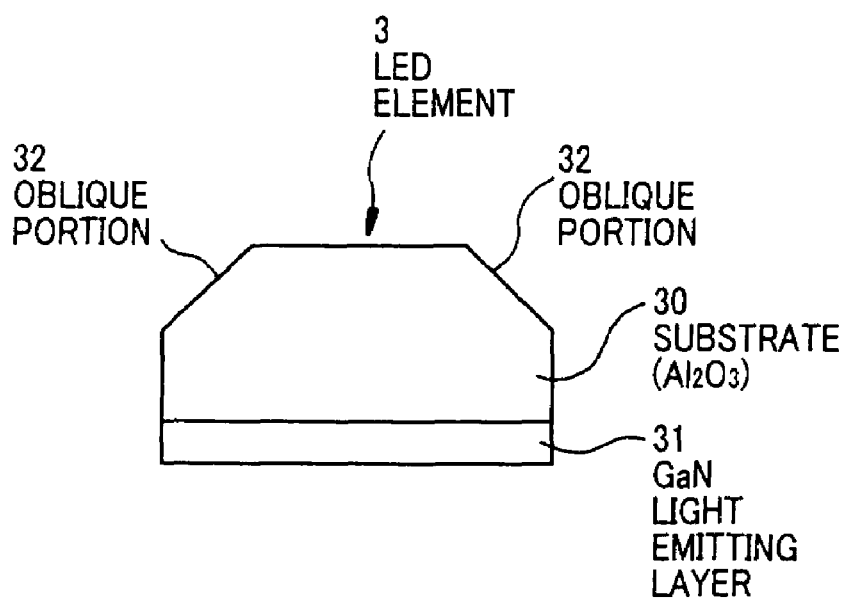
FIG. 8B is an enlarged side view showing an LED element in FIG. 8A.

FIG. 8A is a cross sectional view showing the central portion of a light emitting device in the fifth preferred embodiment of the invention. FIG. 8B is an enlarged side view showing an LED element in FIG. 8A.

The light emitting device 1 uses the flip-chip type LED element 3 that the substrate 30 of LED element 3 as described in the first embodiment is of GaN.

In the fifth embodiment, the substrate 30 of GaN has a big refractive index of n=2.4 and therefore the light extraction efficiency can be enhanced. Light not to be radiated when using the substrate 30 of $Al_2O_3$ can be externally radiated from the GaN light emitting layer 31. Further, if the LED element 3 is formed as a rectangular solid, an incident mode exceeding the critical angle to the interface of LED element 3 will be generated. However, the oblique portion 32 formed on the substrate 30 allows the radiation of light from the GaN light emitting layer 31 even in such an incident mode. Thus, loss in light radiation can be reduced.

The material of substrate 30 is not limited to GaN and may be SiC etc. that has a refractive index similar to that of GaN substrate 30.

Figure 9:
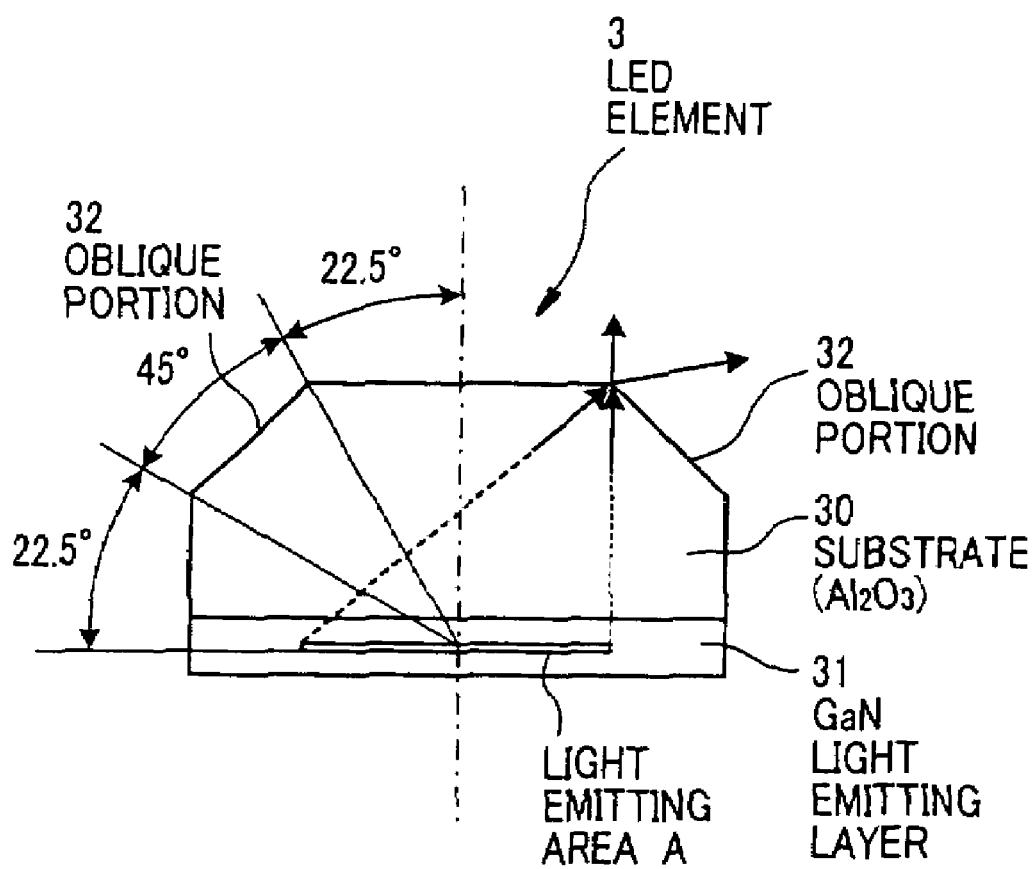
FIG. 9 illustrates a light emitting area and a light radiation of an LED element in a sixth preferred embodiment of the invention.

FIG. 9 illustrates a light emitting area and a light radiation of an LED element in the sixth preferred embodiment of the invention.

As shown, the LED element 3 has a light emitting area A smaller than the element size, whereby the probability of primary light to be externally radiated from the GaN light emitting layer 31 can get close to the ideal. Thereby, the light extraction efficiency from the LED element 3 can be further enhanced. Similarly to the embodiment described above, the flip-chip type light emitting element with the electrode formed on the lower surface is employed, and, therefore, nothing but the electrode on the lower surface interferes with the light extraction from the LED element 3.

Although in the above embodiments the LED element 3 is sealed with the low-melting glass with a refractive index of n=1.5, it may be sealed with glass with a high refractive index of n=1.9. Thereby, even when the LED element 3 has a light emitting area nearly equal to the element size, light is not confined in the LED element 3 and the light extraction efficiency can be enhanced. Therefore, since the light output is not saturated according as current applied increases, the output of the light emitting device 1 can be increased.

Although the sealing portion of LED element 3 is of glass, even when using the sealing portion of resin, the internal stress can be obviously reduced. Thereby, the cracking of resin sealing portion can be prevented.

Although in the above embodiments the light emitting layer is of GaN, it may be of the other material such as GaAs and AlInGaP. In this case, the same effects as described in the fourth embodiment can be obtained. Further, if the substrate has a refractive index nearly equal to that of the light emitting layer or that or higher of the high refractive glass, the same effects as described in the fifth and sixth embodiments can be obtained.

FIG. 10A is a plain view showing a light emitting device in the seventh preferred embodiment of the invention. FIG. 10B is a cross sectional view cut along a line A-A in FIG. 10A. FIG. 10C is a cross sectional view cut along a line B-B in FIG. 10A. Although a lead frame is generally, at its both sides, provided with a strip-shaped portion to be connected at the outer lead side, such a portion is not shown in the drawings. Further, although a plurality of LED elements are generally mounted on the lead frame, only one LED element is shown in the drawings.

The light emitting device 110 is composed of: a metal base 111 as a radiator; a metal reflection mirror 112 (reflection mirror portion) stacked on the metal base 111; a submount 113 mounted at a predetermined position of the metal base 111; an LED element 114 mounted on the submount 113; insulating seal glasses 115a, 115b embedded in a groove (not shown) formed on the metal base 111 and disposed linearly on both sides of submount 113; leads (metal leads) 116a, 116b disposed overlapping with the insulating seal glasses 115a, 115b; insulating seal glasses 117a, 117b disposed overlapping with the leads 116a, 116b; and a sealing member 118 of transparent glass or resin filled inside the metal reflection mirror 112. The light emitting device 110 has, as a whole, a short cylindrical shape.

The metal base 111 is of metal such as copper and aluminum with a good thermal conductivity. It has such a thickness and dimensions that a sufficient radiation effect can be obtained according to the consumed power of LED element 114.

The metal base 111 is provided with the linear groove (not shown) centered at the LED element 114. The groove has such a depth that the insulating seal glasses 115a, 115b, the leads 116a, 116b and the insulating seal glasses 117a, 117b can be embedded therein. The leads 116a, 116b are disposed in the groove while being sandwiched between the insulating seal glasses 115a, 115b and the insulating seal glasses 117a, 117b. Therefore, the leads 116a, 116b are electrically insulated from the metal base 111. Although the metal base 111 has the same size as the metal reflection mirror 112, it may be larger than the metal reflection mirror 112 or may have another shape such as a rectangle.

The metal reflection mirror 112 is of metal such as copper and aluminum with a good thermal conductivity. It has a cone-shaped hollow concave portion formed at the center. Its reflection surface 112a is formed by mirror-finishing the inner surface thereof with silver deposition, chrome or silver plating or silver or by conducting the white surface treatment thereon. Thereby, light emitted laterally to the metal reflection mirror 112 can be effectively conducted in the front direction. Further, since the metal reflection mirror 112 is of metal such as copper with a good thermal conductivity, it also functions as a radiator other than a reflection mirror.

The submount 113 is of a material such as AlN (aluminum nitride) with a high thermal conductivity, and it may be, if necessary, provided with a built-in Zener diode for dielectric breakdown prevention. The submount 113 has an uneven rectangular shape, where the LED element 114 is mounted on the top surface and the tip portion of leads 116a, 116b are disposed on the both upper surfaces at the lower level. The submount 113 has electrodes (not shown) at the upper surface and side surface. The connection between the upper electrode and the side electrode can be made through a wiring layer or a through hole, which is not shown in the drawings.

The LED element 114 is of, e.g., GaN or AlInGaP and of high output type. The chip size may be 0.3×0.3 mm (standard size), 1×1 mm (large size) etc. The LED element 114 is of flip-chip (FC) type using the electrode or bump as connection element, although the connection portion under the element is not shown in the drawing. The FC type is suitable in using a glass material with high viscosity as the sealing member 118. Alternatively, the LED element 114 may be of face-up type using a wire as connection element. In this case, if the wire may be deformed by glass sealing, a resin material with low viscosity can be used as the sealing member 118.

The insulating seal glasses 115a, 115b, 117a and 117b are of glass with a thermal expansion coefficient equal to that of the metal base 111 and leads 116a, 116b, while they do not need to be transparent. The sealing member 118 is of transparent silicone resin or of transparent low-melting glass.

The process of assembling the light emitting device 110 will be explained below.

At first, the submount 113 is mounted at the center of metal base 111 and secured thereon through adhesives etc. Then, the stick-shaped insulating seal glasses 115a, 115b are disposed in the groove on the metal base 111, and then the leads 116a, 116b and the insulating seal glasses 117a, 117b are stacked on the insulating seal glasses 115a, 115b. Then, the metal reflection mirror 112 is mounted on the insulating seal glasses 117a, 117b and on the exposed surface of metal base 111. In this state, by conducting the pressing at a high temperature, the insulating seal glasses 115a, 115b, 117a and 117b, the leads 116a, 116b and the metal reflection mirror 112 are bonded each other.

The leads 116a, 116b are insulated at the side surface and the lower and upper surfaces except for the tip portion by the insulating seal glasses 115a, 115b, 117a and 117b. Therefore, they are not in contact with the metal base 111 and the metal reflection mirror 112. Then, the LED element 114 is mounted on the top surface of submount 113, and, by conducting the reflowing, the electrode or wiring layer of the submount 113 is solder-connected and bonded to the bump or electrode of the LED element 114. Finally, the sealing member 118 of silicone resin is filled in the cone-shaped hollow concave portion of the metal reflection mirror 112. Thus, the assembling of the light emitting device 110 is completed.

For example, when the lead 116a is connected to the anode side of LED element 114, the positive side of DC power source (not shown) is connected to the lead 116b and the negative side thereof is connected to the lead 116b. When power source is supplied, current is flown from the lead 116a through the submount 113, LED element 114 and submount 113 to the lead 116b. Thereby, the LED element 114 emits light. Light emitted from the upper surface of LED element 114 is externally radiated while passing through the sealing member 118, and light emitted from the side of LED element 114 is reflected on the metal reflection mirror 112, being externally radiated while passing through the sealing member 118.

The next effects are obtained by the seventh embodiment.

(1) Since the leads 116a, 116b are insulated by the insulating seal glasses 115a, 115b, 117a and 117b, the contact between the leads 116a, 116b and the metal base 111 or the metal reflection mirror 112 can be prevented.

(2) Since the metal base 111 and the metal reflection mirror 112 are directly contacted each other at part except for the mount portion of leads 116a, 116b, heat to be conducted from the LED element 114 to the submount 113 and leads 116a, 116b is effectively conducted to the metal base 111 and metal reflection mirror 112, whereby heat can be radiated through the metal base 111 and metal reflection mirror 112. Thus, even when the LED element 114 is of high output type, the thermal radiation efficiency can be enhanced such that a thermal damage to the LED element 114, the insulating seal glasses 115a, 115b, 117a and 117b, and the sealing member 118 can be avoided. This effect is significant to a large-size light emitting device.

(3) The light emitting device does not use any resin material with low heat resistance at the supporting portions, and the leads 116a, 116b are attached through the glass material to the metal base 111. Therefore, it can sufficiently bear the reflowing applied to lead-free solder.

Figure 11A:
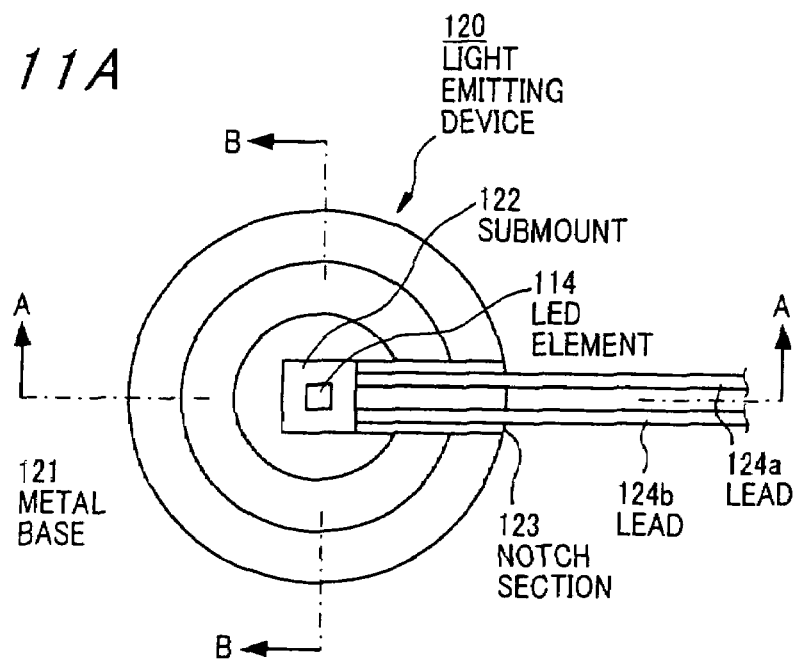
FIG. 11A is a plain view showing a light emitting device in an eighth preferred embodiment of the invention.
Figure 11B:
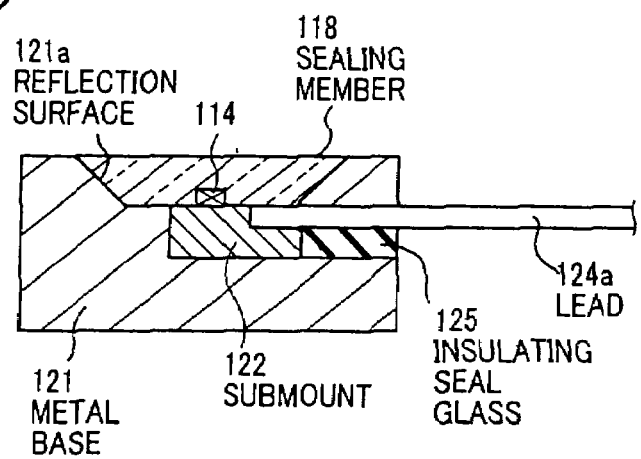
FIG. 11B is a cross sectional view cut along a line A-A in FIG. 11A.
Figure 11C:
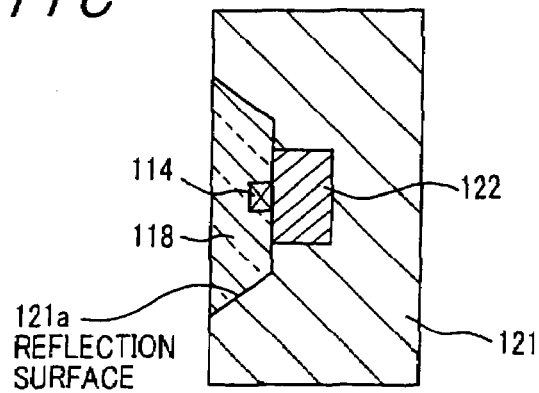
FIG. 11C is a cross sectional view cut along a line B-B in FIG. 11A.

FIG. 11A is a plain view showing a light emitting device in the eighth preferred embodiment of the invention. FIG. 11B is a cross sectional view cut along a line A-A in FIG. 11A. FIG. 11C is a cross sectional view cut along a line B-B in FIG. 11A. Like components are indicated by the same numerals used in the seventh embodiment.

The light emitting device 120 of the eighth embodiment is different from the light emitting device 110 of the seventh embodiment in the way of drawing out the lead and in the structure of metal base integrated with the metal reflection mirror. Namely, the leads for anode and cathode are drawn out in the same direction, and the metal base 121 composed integrating the metal reflection mirror portion and radiator portion is fabricated by die machining or milling operation etc.

The light emitting device 120 is composed of: the metal base 121 to function as a radiator and a reflection mirror; a submount 122 mounted on a predetermined position of the metal base 121; an LED element 114 mounted on the submount 122; a groove-shaped notch section 123 formed in the metal base 121; leads 124a, 124b disposed in the notch section 123 while securing a certain space; a sealing member 118 filled in a convex portion of the metal base 121; and insulating seal glass 125 that is shaped like a square bar and insulates the leads 124a, 124b from the metal base 121.

The metal base 121 is of the same material as the metal base 111 and metal reflection mirror 112 in the seventh embodiment. The metal base 121 is provided with a cone-shaped hollow reflection surface 121a to locate the LED element 114 at the center, and with the vertical groove-shaped notch section 123 to house the leads 124a, 124b to be insulated. The notch section 123 has insulating seal glass 125 disposed at the bottom, and the leads 124a, 124b are disposed on the insulating seal glass 125.

The submount 122 is of a material such as AlN (aluminum nitride) with a high thermal conductivity, and it may be, if necessary, provided with a built-in Zener diode for dielectric breakdown prevention. As shown in FIG. 11B, the step portion of submount 122 is formed on only one side (on the right side of FIG. 11B), and the tip portions of leads 124a, 124b are disposed in parallel on the upper surface of the step portion and the tip surface or lower surface is connected through a solder etc. to the electrode (not shown) on the submount 122 side.

The process of fabricating the light emitting device 120 will be explained below.

At first, the submount 122 is disposed at the center of metal base 121 and bonded thereto through adhesives etc. Then, the tip portions of leads 124a, 124b are disposed in parallel in contact with the step portion of submount 122, and then, in this state, the tip portions of leads 124a, 124b are connected to the electrode (or part of wiring layer) of the submount 122 by heating in a heating oven etc. Then, the LED element 114 is mounted on the top surface of submount 122, and then the LED element 114 is electrically and physically connected to the circuit section (electrode, wiring layer etc.) of submount 122 by reflowing. Alternatively, after the LED element 114 is mounted on the submount 122, the leads 124a, 124b may be disposed and connected to the submount 122.

The next effects are obtained by the eighth embodiment.

(1) The notch section 123 houses only the leads 124a, 124b and its upper portion is kept as a space. The reflection surface 121a of metal base 121 does not exist at the notch section 123. Although during operating the LED element 114 a little unevenness must occur in emitted light, the metal base 121 can be composed integrating the metal base 111 and metal reflection mirror 112 in the seventh embodiment. Therefore, the number of steps in the fabrication can be reduced and the processing can be facilitated. The fabrication cost can be also reduced.

Figure 12:
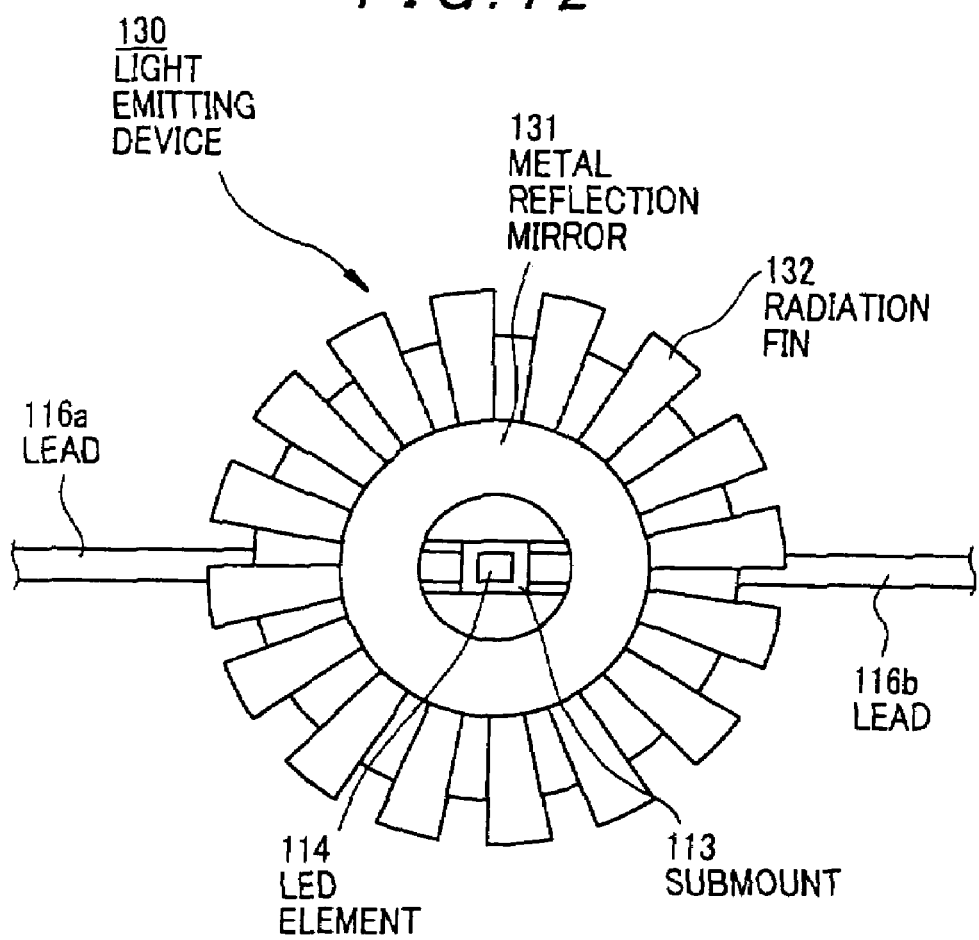
FIG. 12 is a plain view showing a light emitting device in a ninth preferred embodiment of the invention.

FIG. 12 is a plain view showing a light emitting device in the ninth preferred embodiment of the invention. The light emitting device in the ninth embodiment is characterized in that the metal reflection mirror of the seventh embodiment is provided with radiation fins attached on the top end.

The light emitting device 130 is composed such that the metal reflection mirror 131 bonded to the metal base 111 is provided with a plurality of radiation fins 132 on the top end. The radiation fins 132 are disposed at certain intervals on the circumference of metal reflection mirror 131 while being centered at the LED element 114.

In the ninth embodiment, by the radiation fins 132, the contact area between the metal reflection mirror 131 and the ambient air can be increased and the radiation can be effectively conducted also in the lateral direction. Thus, due to the increased radiation area, a good radiation effect can be obtained.

Figure 13:
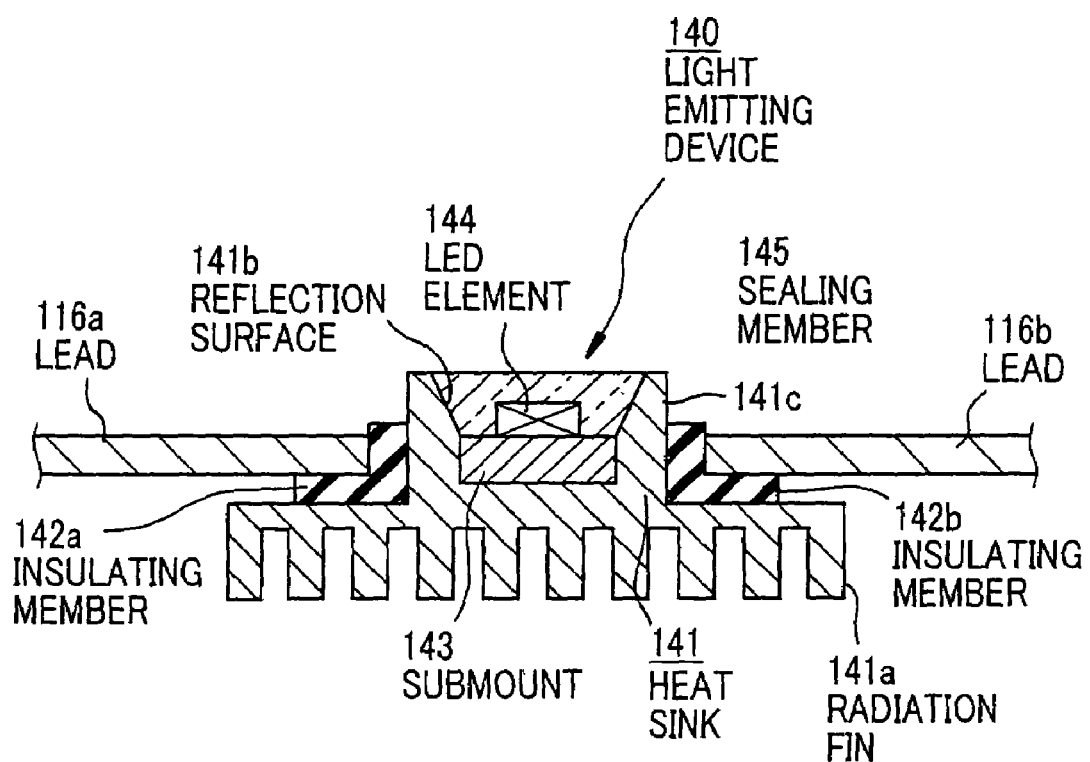
FIG. 13 is a cross sectional view showing a light emitting device in a tenth preferred embodiment of the invention.

FIG. 13 is a cross sectional view showing a light emitting device in the tenth preferred embodiment of the invention.

The light emitting device in the tenth embodiment is characterized in that the function of metal base and the function of metal reflection mirror as described in the above embodiments are integrated.

The light emitting device 140 is composed of: a heat sink 141 with a step portion; insulating members 142a, 142b disposed at a lead-attached position on the step portion; leads 143a, 143b disposed such that its tip is located on the horizontal portion of the insulating members 142a, 142b; a submount 143 attached to the bottom of a cone-shaped hollow concave portion formed at the upper part of heat sink 141; an LED element 144 mounted on the submount 143; and a sealing member 145 that is of glass or resin and filled in the concave portion of submount 143 to cover the LED element 144.

The heat sink 141 is of copper, and it is composed of: radiation fins 141a formed at part lower than the step portion; and a reflection mirror section 141c formed at part higher than the step portion, formed cylindrical, having a cone-shaped hollow reflection surface 141b on the inside.

The insulating members 142a, 142b are L-shaped in cross section and disposed closely contacting the outer surface of the reflection mirror section 141c. Although the insulating members 142a, 142b are shown as two L-shaped parts, they may be a ring with L-shaped cross section. The insulating members 142a, 142b are of a material such as glass and ceramic with heat resistance and insulating property, and preferably have a thermal expansion coefficient equal to that of the leads 116a, 116b or heat sink 141.

The submount 143 is of the same material as the submount 113, 123. For the purpose of simplifying the drawing, the composition (wiring conductor, electrode, through-hole etc.) to connect the leads 116a, 116b to the LED element 144 through the submount 143 is omitted.

In the operation of the light emitting device 140, heat from the LED element 144 is conducted through the submount 143 to the heat sink 141, most part thereof is radiated by the radiation fins 141a, and the other part is radiated by the reflection mirror section 141c. The radiation fins 141a have a large contact area to the ambient air, and thereby the heat exchange is effectively conducted.

In the tenth embodiment, since the radiation fins 141a are integrated with the reflection surface 141b, part to prevent the heat radiation does not exist therebetween. Therefore, the heat radiation effect of light emitting device 140 can be improved as compared to the other embodiments. Further, because of the simple structure, the fabrication can be simplified.

The heat sink 141 may be of a metal such as Al, AlN (aluminum nitride) with good thermal conductivity, other than copper.

Although in the tenth embodiment the heat sink 141 is composed integrating the metal base 111 and metal reflection mirror 112 in the other embodiment and the radiation fins 141a are provided at the lower part, alternatively the metal base 111 and metal reflection mirror 112 may be separated, as described in the other embodiments, while providing the metal base 111 with the radiation fins 141a.

FIG. 14 shows a light emitting device in the eleventh preferred embodiment of the invention.

The light emitting device 150 of the eleventh embodiment is characterized in that most of heat radiation is conducted by an additional device while in the above embodiments the heat radiation is conducted by the metal base and metal reflection mirror or the heat sink. The additional device can be a heat pipe or a device having the same principle.

The light emitting device 150 has the same basic composition as the seventh embodiment, and the insulating seal glasses 115a, 115b, 117a and 117b and leads 116a, 116b are not shown in the drawing and the shape of submount is simplified.

The light emitting device 150 uses a sheet heat sink 151 to conduct heat from the LED element 114. The sheet heat sink 151 may be "peraflex" (registered trademark). The sheet heat sink 151 is suitable for the case that the light emitting device 150 cannot be further enlarged, the case that a sufficient radiation space cannot be secured by the heat generating section, or the case that the heat radiation must be conducted outside the housing. Further, the dimensions of sheet heat sink 151 are only 0.6 mm thick, 20 mm wide and 150 mm long, but it can be applied to a radiation capacity up to about 10 watts.

The sheet heat sink 151 has its one end disposed at the upper surface (surface to contact the submount 113) of metal base 111 and the other end attached to a radiator 152. Instead of the radiator 152, another member such as a housing to house the light emitting device 150 can be used. Although the sheet heat sink 151 is disposed at the upper surface of metal base 111, it may be disposed at the bottom surface of metal base 111.

In the eleventh embodiment, since the sheet heat sink 151 is attached to the metal base 111, the heat radiation efficiency can be enhanced even when the thickness of metal base 111 is reduced. The temperature rise of light emitting device 150 caused by operating the LED element 114 for long hours can be prevented. Thus, it is suitable for a high-output type.

Although radiation fins 112a, which are not provided in the light emitting device 110 of the seventh embodiment, are provided at the metal reflection mirror 112, they may be not provided.

Figure 15A:
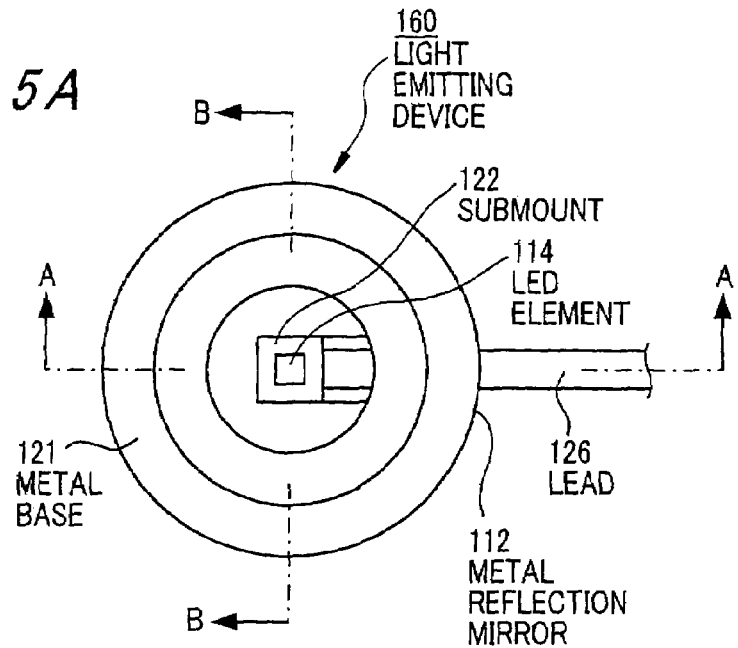
FIG. 15A is a plain view showing a light emitting device in a twelfth preferred embodiment of the invention.
Figure 15B:
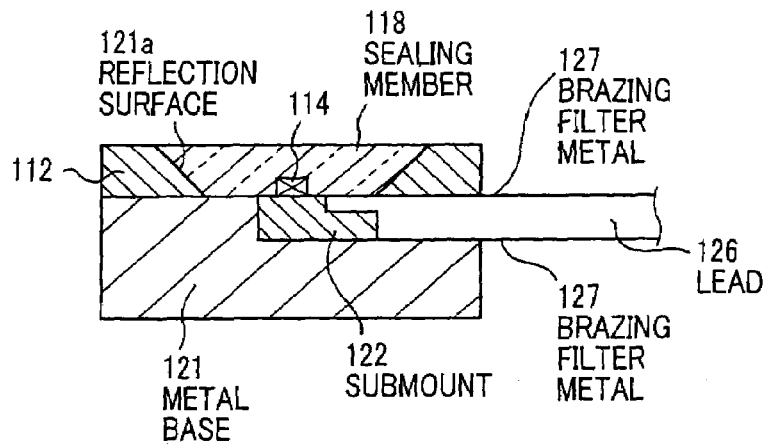
FIG. 15B is a cross sectional view cut along a line A-A in FIG. 15A.
Figure 15C:
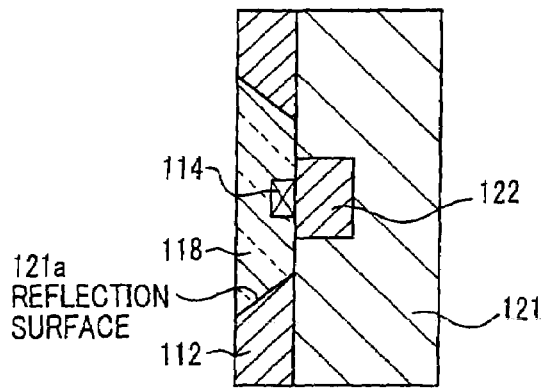
FIG. 15C is a cross sectional view cut along a line B-B in FIG. 15A.

FIG. 15A is a plain view showing a light emitting device in the twelfth preferred embodiment of the invention. FIG. 15B is a cross sectional view cut along a line A-A in FIG. 15A. FIG. 15C is a cross sectional view cut along a line B-B in FIG. 15A.

The light emitting device 160 is different from that of the seventh embodiment in that a lead 126 is of a multilayer ceramics substrate and is secured through brazing filler metal to the metal base 121 and the metal reflection mirror 112.

Figure 16A:
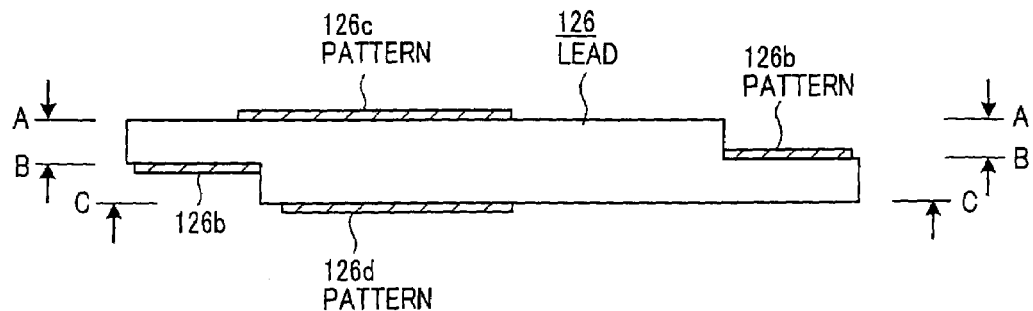
FIG. 16A is a side view showing a lead in the twelfth embodiment.
Figure 16B:
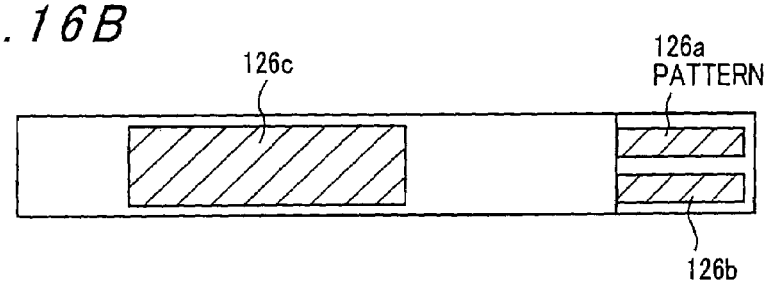
FIG. 16B is a plain view illustrated along a line A-A in FIG. 16A.
Figure 16C:
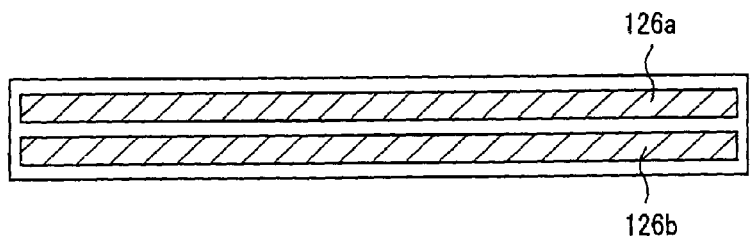
FIG. 16C is a sectional view cut along a line B-B in FIG. 16A.
Figure 16D:
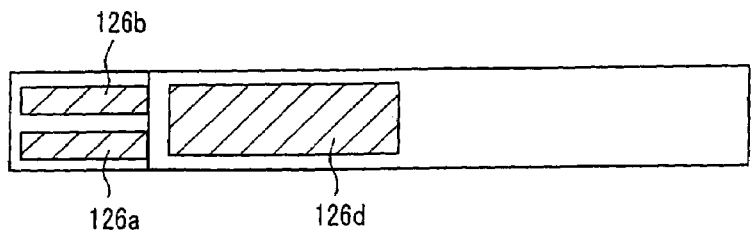
FIG. 16D is a bottom view illustrated along a line C-C in FIG. 16A.

FIG. 16A is a side view showing the lead in the twelfth embodiment. FIG. 16B is a plain view illustrated along a line A-A in FIG. 16A. FIG. 16C is a sectional view cut along a line B-B in FIG. 16A. FIG. 16D is a bottom view illustrated along a line C-C in FIG. 16A.

The lead 126 is a two-layer substrate of glass containing $Al_2O_3$ (thermal expansion coefficient: $13.2 \times 10^{-6}/°$ C.), and has metal patterns 126a, 126b, 126c and 126d formed thereon. The patterns 126a, 126b are intended to supply power to the LED element 114, and are exposed at the contact portion to the submount 122 and at its external terminal, but most part thereof passes through inside the substrate. The patterns 126c, 126d are not intended to electrical connection but to be bonded through the brazing filler metal to the metal base 121 or metal reflection mirror 112. The brazing metal filler is of Au—Si materials (melting temperature: 360° C., thermal expansion coefficient: 13.9×10$^{-6}$/° C.).

The actual leads 126*a*, 126*b* pass through inside the ceramics insulating member with a heat resistance, and therefore, even when the lead 126 is secured using a conductive material, no short circuiting is generated. The ceramics member has a thermal expansion coefficient nearly equal to that of copper material (thermal expansion coefficient: 16×10$^{-6}$/° C.). Therefore, separation or cracking caused by a difference in thermal expansion coefficient will be not generated even when processed at a high-temperature.

Although the anode and cathode are drawn out in the same direction, the short circuiting between the patterns 126*a*, 126*b* can be prevented because the circuit pattern can be accurately formed on the substrate.

Further, when electrically connecting with the external terminal, the soldering can be easily performed because heat release from the patterns on the glass containing $Al_2O_3$ substrate with relatively low thermal conductivity is suppressed.

In the above embodiments, a phosphor layer may be disposed in the sealing members 118, 145 to conduct the wavelength conversion. The phosphor layer is, for example, if the LED element emits blue light, composed of phosphor: Ce (cerium):YAG (yttrium aluminum garnet) with a property to radiate yellow light while being excited by the blue light.

In the above embodiments, a reflection surface may be formed on the surface of insulating seal glasses 117*a*, 117*b* and submounts 113, 123, 143 at the bottom of the metal reflection mirrors 112, reflection surface 141*b* by silver or aluminum plating or deposition so as to enhance the light radiation efficiency.

Although in the above embodiments one LED element is disposed in one sealing member, a multi-emission type light emitting device with two or more LED elements can be offered. The multiple LED elements mounted may be composed of LED elements of different emission colors or LED elements of a same emission color. Further, the drive mode of LED element may be such that all or each group of the LED elements are connected in parallel or in series.

Although the sealing members 118, 145 have a flat top surface, they may have its top surface of another shape such as a semisphere.

Although in the above embodiments the LED elements 114, 144 are flip-chip mounted, they may be face-up mounted (anode, cathode electrodes being disposed at the upper surface and connected through wires), or may be mounted such that anode, cathode electrodes each are disposed at the upper or lower surface and the upper electrode is electrically connected through a wire. In the case of being other than flip-chip type, the LED element may be mounted directly on the metal base 111, 121 or heat sink 141, without using the submount 113, 122, 143. If the submount is provided, a stress caused by heat generated from the LED element according to a difference in thermal expansion coefficient between the LED element and the metal base or the heat sink can be more reduced. However, the heat radiation property in the case of directly mounting the LED element is better than that in the case of using the submount.

FIG. 17A is a plain view showing a light emitting device in the thirteenth embodiment of the invention. FIG. 17B is a cross sectional view cut along a line A-A in FIG. 17A.

The light emitting device 201 is composed of: an LED element 211; a submount 212 on which the LED element 211 is mounted; a support member 213 to hold the submount 212 in its penetrating hole; and a sealing member 214 (glass seal portion) to seal the submount 212 and the support member 213 in the vicinity of submount 212.

The LED element 211 is of a material (thermal expansion coefficient: 4-6×10$^{-6}$/° C.) such as GaN and AlInGaP, and of high output type. The LED element 211 is of flip-chip type having, at the bottom surface, electrodes 211*a* (or solder bumps) used to connect with a wiring layer on the support member 213.

The submount 212 is of a material such as $Al_2O_3$ (aluminum oxide, thermal expansion coefficient: 7×10$^{-6}$/° C.) with a thermal expansion coefficient nearly equal to that of LED element 211. The top surface (exposed from the support member 213) of submount 212 has an area twice or smaller, preferably equal to, that of LED element 211. The submount 212 has wiring layers 212*a*, 212*b* extending from the top surface to the side face, thereby connected with the electrodes 211*a* of LED element 211. The support member 213 can be, if necessary, provided with a built-in Zener diode for dielectric breakdown prevention.

The support member 213 is of ceramic, glass-contained $Al_2O_3$ (thermal expansion coefficient: 13×10$^{-6}$/° C.), and has the penetrating hole formed at a predetermined position to receive the submount 212 inserted thereinto. The penetrating hole is provided with wiring layers 213*a*, 213*b* formed from the upper surface of support member 213 through the inside face of penetrating hole to the bottom surface of support member 213 to be connected with the wiring layers 212*a*, 212*b*.

The sealing member 214 is of transparent low-melting glass (thermal expansion coefficient: 11×10$^{-6}$/° C.) with a thermal expansion coefficient nearly equal (within 15% in the ratio of a difference in thermal expansion coefficient between the support member 213 and the sealing member 214 to the thermal expansion coefficient of support member 213) to that of support member 213. The low-melting glass has a thermal expansion coefficient greater than glass generally used. If the low-melting glass is not used, the LED element 211 is subjected to a thermal damage in the processing.

The process of fabricating the light emitting device 201 will be explained below.

In a separate step, the submount 212 is provided with the wiring layers 212*a*, 212*b*, and the LED element 211 is provided with the electrode 211*a*. At first, the support member 213 is, at a predetermined position, provided with the penetrating hole that allows the submount 212 to be inserted thereinto, then provided with the wiring layers 213*a*, 213*b* extending through the penetrating hole. Then, the submount 212 is inserted into the penetrating hole of support member 213. At that time, while opposing the wiring layers 212*a*, 212*b* to the wiring layers 213*a*, 213*b*, it is inserted thereinto through a brazing filler metal (Au—Si). In this state, by melting the brazing filler metal between the wiring layers at a temperature of 400° C. or higher, the submount 212 is bonded to the support member 213. Alternatively, after the LED element 211 is mounted on the submount 212, the submount 212 with the LED element 211 mounted thereon may be inserted into the support member 213.

Then, while aligning the polarity of the wiring layers 212*a*, 212*b* with that of the electrodes 211*a*, the LED element 211 is mounted through Au bumps on the top surface of submount 212. Thus, the LED element 211 can be connected and bonded. Then, the LED element 211 and the top surface of the support member 213 in the vicinity of LED element 211 are covered and sealed with the sealing member 214. Although in FIG. 17 the sealing member 214 is disposed while having an even thickness, it may be disposed such that a lens-shaped portion is formed on the LED element 211.

For example, when the wiring layer 213*a* is connected to the anode side of LED element 211, the positive side of DC power source (not shown) is connected to the wiring layer 213a and the negative side thereof is connected to the wiring layer 213b. When power source is supplied, current is flown from the wiring layer 213a through the wiring layer 212a, LED element 211 and wiring layer 212b to the wiring layer 213b. Thereby, the LED element 211 emits light. Light emitted from the upper surface of LED element 211 is externally radiated while passing through the sealing member 214.

The next effects are obtained by the thirteenth embodiment.

(1) Since the sealing member 214 is of glass transparent to a targeted wavelength, degradation caused by light and heat is very small as compared to sealing resin. Therefore, a stable emission property can be obtained for long hours.

(2) Since the thermal expansion coefficient is equalized between the LED element 211 and the submount 212, a stress at the LED element 211 and the submount 212 can be reduced that is caused by a temperature difference between a high-temperature state and a room-temperature state in the processing of glass, or by a temperature difference between the turn-on and turn-off of LED element 211. Therefore, the reliability can be enhanced.

(3) The thermal expansion coefficient is equalized between the LED element 211 and the submount 212, the submount 212 is held inserted into the penetrating hole of support member 213, and the submount 212 has the mount surface nearly equal to the size of LED element 211. Thereby, at a portion with the wide contact area and the longest linear distance between the support member 213 and the sealing member 214, a stress caused by a temperature difference between a high-temperature state and a room-temperature state in the processing of glass can be reduced to prevent the occurrence of separation and cracking.

Further, the LED element 211 and submount 212 with a low thermal expansion coefficient have a reduced size (nearly equal to the LED element 211) as much as possible as compared to the sealing member 214, and a compressive force is applied thereto in the cooling process of glass. Thereby, the occurrence of separation and cracking can be prevented. Thus, the glass-sealed LED can be fabricated.

(4) Since the sealing member 214 is of glass, the sealing member 214 can be bonded to the support member 213 through a chemical reaction. Therefore, as compared to using resin as the sealing member 214, the boundary separation therebetween can be reduced. Further, a compact package can be fabricated because a sufficient adhesion force can be obtained even when the bonding area between the support member 213 and the sealing member 214 is small.

(5) The support member 213 is provided with the sealing member 214 on one side thereof, and it is provided with the wiring layers 213a, 213b as external terminals on the other side. Therefore, a compact surface-mounted device type light emitting device can be fabricated.

(6) Since the components are all of heat-resisting materials and a stress caused by temperature change is reduced, it can sufficiently bear the reflowing applied to lead-free solder.

The glass used for the sealing member 214 may be a hybrid glass composed of organic and inorganic materials. Even such a material can offer a heat resistance, a light stability and a low melting point. However, its thermal expansion coefficient is greater than glass generally used, like the low-melting glass as described earlier.

The submount 212 may be of AlN or silicon other than $Al_2O_3$.

Although the penetrating hole is formed to insert the submount 212 into the support member 213, the penetrating hole is not necessarily formed if the exposed area of the submount 212 to the sealing member 214 is not so large.

FIG. 18 is a cross sectional view showing a modification of the support member in the light emitting device in the thirteenth embodiment. In FIG. 18, only main part, an LED mount portion is shown and the other part such as sealing member is not shown.

Although in the light emitting device 201 in FIG. 17 one LED element is mounted, a plurality of LED elements can be mounted so as to emit three colors of R, G and B or to increase the number of one color to enhance the brightness or to improve the color rendering.

In such a case, as shown in FIG. 18, the submount 221 of the light emitting device 220 can have an increased area on its top mount portion according to the number of LED elements mounted. In this embodiment, three LED elements 222a, 222b and 222c are mounted on the submount 221. Although the submount 221 has a different size, the material used is the same as the submount 212. Also in this case, in order to reduce the stress, the top mount portion of the submount 221 needs to have the minimum area that the three LED elements 222a, 222b and 222c can be mounted thereon.

The light emitting device 220 in FIG. 18 has the LED elements 222a, 222b and 222c disposed at even intervals on the same plane. The LED elements 222a, 222b and 222c may all have the same emission color or each have one emission color of R, G and B. The submount 221 is, other than the wiring layers 212a, 212b, provided with an electrode 221a connected to the LED element 222b and electrodes 221b, 221c connected to the other electrodes of the LED elements 222a, 222c on the top surface. The electrodes 221a, 221b and 221c are anode-anode or cathode-cathode connected through a through-hole (not shown) inside the submount 221 or a wiring layer (not shown) on the top surface.

In this composition, even when the multiple LED elements 222a, 222b and 222c are mounted, a stress caused by thermal expansion/contraction between the support member 213 and the sealing member (not shown) can be reduced and a stress caused by thermal expansion/contraction at the LED elements 222a, 222b and 222c and the submount 221 can be reduced. Thereby, the light emitting device can have a good reliability.

Figure 19A:
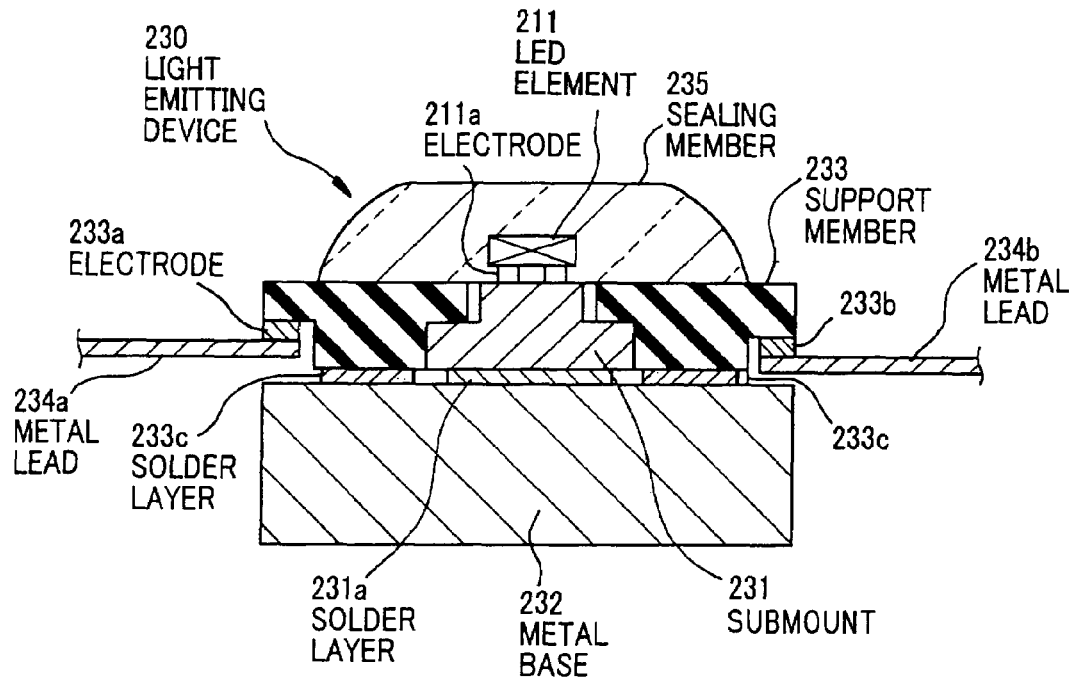
FIG. 19A is a cross sectional view showing a light emitting device in a fourteenth preferred embodiment of the invention.
Figure 19B:
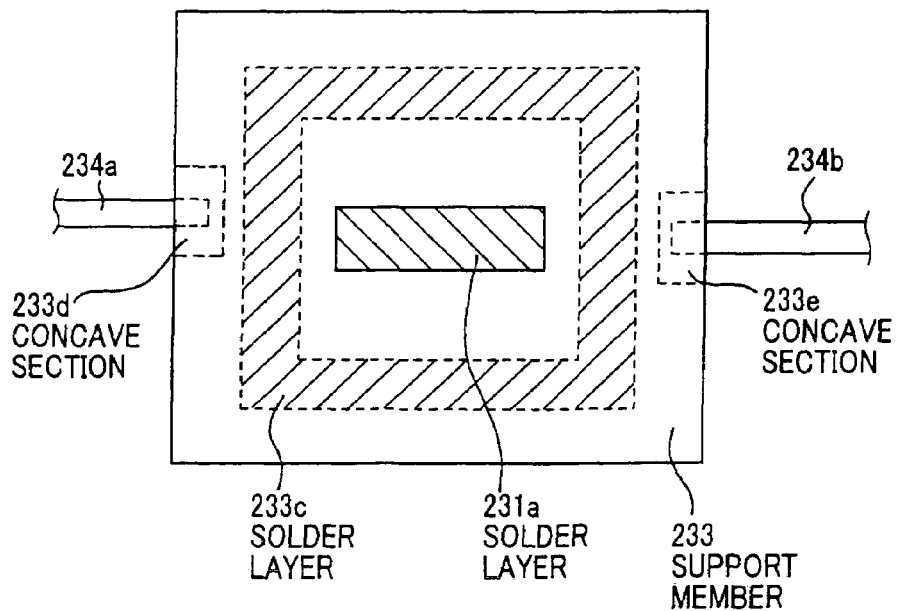
FIG. 19B is a plain view showing the disposition of solder layers and metal leads in FIG. 19A.

FIG. 19A is a cross sectional view showing a light emitting device in the fourteenth preferred embodiment of the invention. FIG. 19B is a plain view showing the disposition of solder layers and metal leads in FIG. 19A.

Although the fourteenth embodiment is basically similar to the thirteenth embodiment, the former is different from the latter in that its submount is of a different material and has a different shape, its support member 233 is a multilayer substrate with a circuit pattern formed therein, and it has a different bonding portion of the support member 233 and its metal base 232. Namely, the light emitting device 230 has the submount 231 that is of AlN (aluminum nitride, thermal expansion coefficient: $5 \times 10^{-6}/°$ C.) with a high thermal conductivity coefficient of 180 $W \cdot m^{-1} \cdot k^{-1}$ and has a convex shape in cross section where a wide step portion is formed on the lower side so as to increase the contact area with the metal base 232. Further, the upper surface of metal base 232 is formed flat so as to make a bonding surface between the metal base 232 and the support member 233.

The light emitting device 230 is provided with metal leads 234a, 234a, instead of the wiring layers 213a, 213b. The support member 233 is provided with concave portions 233d, 233e such that the metal leads 234a, 234a does not contact the metal base 232, and the tips of metal leads 234a, 234a are connected to the inside of concave portions 233d, 233e. Electrodes 233a, 233b are provided under the lower surface of concave portions 233d, 233e to be connected with the metal leads 234a, 234a. The submount 231 and support member 233 have, in stead of the wiring layers 213a, 213b, a wiring layer or through holes formed on the inside so as to provide a connection path from the electrode 211a of LED element 211 to the electrodes 233a, 233b.

Part where the submount 231 contacts the metal base 232 is provided with a metal pattern being not used for electrical connection and a solder layer 231a being soldered to the metal base 232. Thereby, the heat radiation to the metal base 232 can be enhanced. Further, the support member 233 is provided with a solder layer 233c at its surface that it contacts the metal base 232. As shown in FIG. 19B, the solder layer 233c is shaped like a square and, therefore, the LED element 211 and submount 231 can be sealed by the sealing member 235, support member 233 and metal base 232 at the contact surface of the support member 233 and the metal base 232.

The sealing member 235, which covers a predetermined region of the LED element 211 and support member 233, is of the same material (with equal thermal expansion coefficient) as the sealing member 214 and is formed into the same seal shape as the sealing member 214.

The process of fabricating the light emitting device 230 is the same as that of the light emitting device 201, except for the attaching of metal leads 234a, 234a. The metal leads 234a, 234a are positioned while inverting the whole components before attaching the metal base 232. Then, the metal base 232 is positioned on the submount 231 and support member 233. In this state, entered into the reflowing oven, the metal leads 234a, 234a and metal base 232 are bonded to the main body side by solder bonding.

The current applying to the light emitting device 230 is conducted like the light emitting device 201 of the thirteenth embodiment, though the wiring layers 213a, 213b in FIG. 17B are replaced by the metal leads 234a, 234a.

The fourteenth embodiment, in addition to the effects of the thirteenth embodiment, has the effects that the submount 231 has a high thermal conductivity, and the lower portion thereof is enlarged to widen the heat radiation path, although the mount surface of LED element 211 has the same area as the LED element 211, and, thereby, heat generated from the LED element 211 can be conducted to the metal base 232 and therefore, the temperature rise during the operation of LED element 211 can be reduced and the reliability can be enhanced.

Further, since the LED element 211 and submount 231 are sealed by the sealing member 235, support member 233 and metal base 232, the penetration of moisture etc. can be prevented.

Further, the electrical terminal area for electrical connection can be secured. The height of submount 231 and support member 233 can be accurately aligned each other. Since the support member 233 is of the multilayer substrate, the restrictions in bonding the metal leads 234a, 234a can be decreased.

Although the submount 231 is of AlN with a thermal conductivity coefficient of 180 W·m$^{-1}$·k$^{-1}$, provided that the thermal conductivity coefficient is 100 or more W·m$^{-1}$·k$^{-1}$, a sufficient effect can be obtained. Another material with a thermal expansion coefficient to the LED element 211 maybe used other than AlN.

Figure 20A:
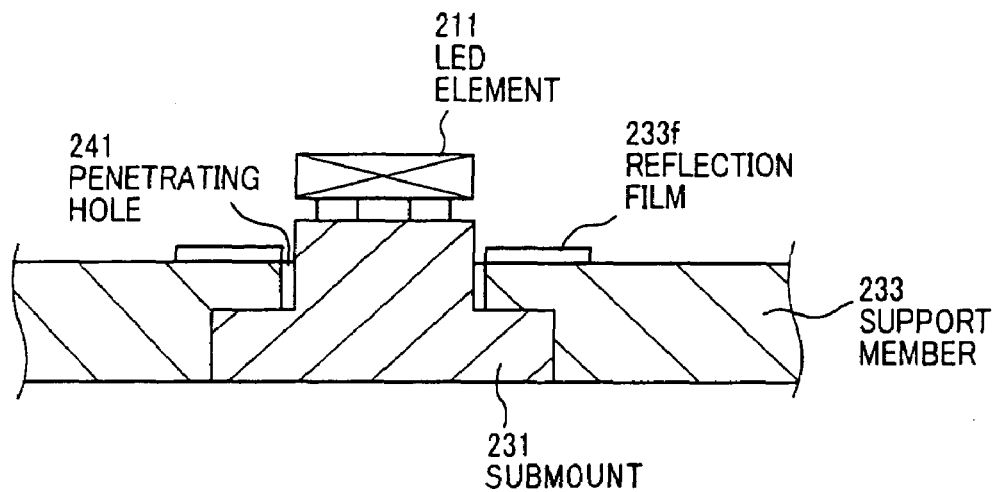
FIG. 20A is a cross sectional view showing a modification of a support member of the light emitting device in the fourteenth embodiment, the support member being provided with a reflection film formed thereon.
Figure 20B:
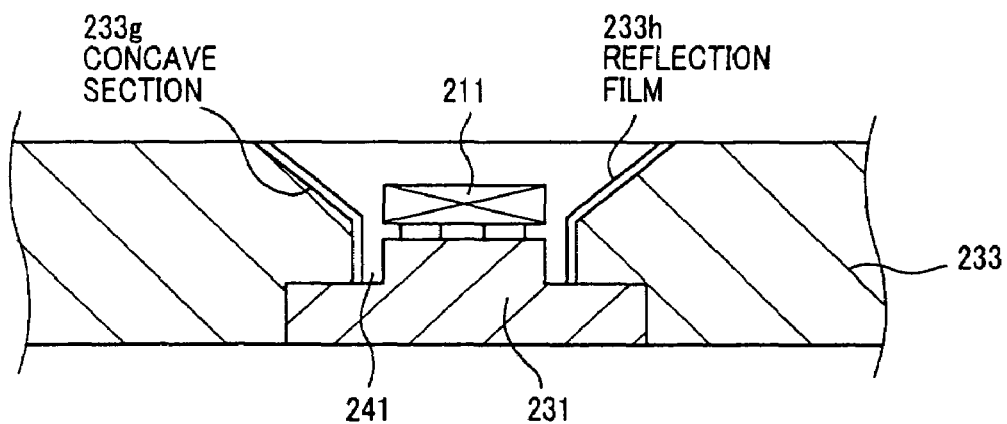
FIG. 20B is a cross sectional view showing another modification of the support member which is provided with a reflection film formed on its convex portion.

FIG. 20A is a cross sectional view showing a modification of the support member of the light emitting device in the fourteenth embodiment, the support member being provided with a reflection film formed thereon. FIG. 20B is a cross sectional view showing another modification of the support member which is provided with a reflection film formed on its convex portion.

Although the support member 233 in FIG. 19A has its upper surface kept original, in this embodiment a reflection film is formed near the LED element 211 so as to enhance the radiation efficiency of light emitted from the LED element 211.

In FIG. 20A, the reflection film 233f is provided around the top end of a penetrating hole 241. In FIG. 20B, a cone-shaped hollow concave portion 233g is formed on the upper side of penetrating hole 241 and the reflection film 233h is provided on the surface of concave portion 233g. The reflection films 233g, 233h may be formed by mirror-finishing with silver deposition, silver plating etc. or by conducting the silver or white surface treatment.

Although, in FIG. 20A, the thickness (height) of submount 231 in FIG. 19A is increased, the support member 233 may be instead thinned while keeping the height of submount 231 as shown in FIG. 19A.

The above modifications, in addition to the effects of the fourteenth embodiment, have the effect that a degree of freedom in designing the submount 231 and support member 233 can be increased.

Although, in FIGS. 20A and 20B, only the two modifications are exemplified, a dedicated reflection mirror may be disposed on the upper surface of support member 233 around the LED element 211. Further, the concave portion 233g may be provided with a semicircular uneven surface or a diamond-cut polygonal surface.

FIG. 21A is a plain view showing a light emitting device in the fifteenth preferred embodiment of the invention. FIG. 21B is a cross sectional view cut along a line B-B in FIG. 21A.

Although the light emitting device 220 in FIG. 18 has the multiple LED elements mounted on one submount, the light emitting device 250 of the fifteenth embodiment has multiple LED elements each of which is provided with one submount.

The light emitting device 250 is composed of: one metal base 251; sixteen submounts 252a, 252b, 252c, 252d, 252e, 252f, 252g, 252h, 252i, 252j, 252k, 252l, 252m, 252n, 252o and 252p (in FIG. 21B, only 252e, 252f, 252g and 252h thereof are shown) mounted at predetermined intervals on the metal base 251; a support member 253 that sixteen penetrating holes are formed therein corresponding to the submounts 252a to 252p such that the submounts 252a to 252p are inserted into the penetrating holes; sixteen LED elements 254a, 254b, 254c, 254d, 254e, 254f, 254g, 254h, 254i, 254j, 254k, 254l, 254m, 254n, 254o and 254p mounted on the top surface of the corresponding submounts 252a to 252p; and a sealing member 255 that covers sealing the support member 253 and the LED elements 254a to 254p. In FIG. 21, the number of submounts and LED elements are sixteen, but it may be varied arbitrarily according to need of the customer.

The submounts 252a to 252p, support member 253 (multilayer susbtrate), LED elements 254a to 254p and sealing member 255 are of the same material, with the same property (thermal expansion coefficient etc.) as the submount 212, support member 213, LED element 211 and sealing member 214 of the thirteenth embodiment. A copper foil layer 258 is provided on the bottom surface (surface on the metal base 251 side) of the submounts 252a to 252p and support member 253 for bonding them to the metal base 251. The copper foils of the submounts 252a to 252p and support member 253 are totally called copper foil 258.

The LED elements 254a to 254p can be divided into LED element groups, each group corresponding to three colors R, G and B, or into LED groups all having one color (e.g., blue).

In detail, the sixteen LED elements 254a to 254p can be divided into the first group of 254a to 254d, the second group of 254e to 254h, the third group of 254i to 254l and the fourth group of 254m to 254p. Four LED elements of each group are connected in series while matching the polarity. One pole (e.g., anode) of the four groups is commonly connected by a wiring (not shown) provided on the submounts 252a to 252p, support member 253, and connected to a terminal 256e.

The other pole (e.g., cathode) of he first to fourth groups is separately connected to each of terminals 256a to 256d, the terminals 256a to 256d are connected to one end of resistors R1 to R4 for current limiting, and the other end of resistors R1 to R4 is connected to terminals 257a to 257d for power source supplying. The resistors R1 to R4 are not built in the submounts 252a to 252p or support member 253 and are externally equipped. For example, when DC power with a predetermined voltage is applied between the terminal 257a and the terminal 256e, the four LED elements 254a to 254d emit light simultaneously. When the power is applied between the terminals 257a, 257d and the terminal 256e, the eight LED elements 254a to 254d and 254m to 254p emit light simultaneously.

The next effects are obtained by the fifteenth embodiment.

(1) In addition to the effect of the fourteenth embodiment, since the light emitting device 250 provides the submount with each LED element, even when the number of LED elements used increases or decreases, the temperature rise during the operation of LED elements 254a to 254p can be reduced. Further, when the number of LED elements is changed, it is not necessary to newly design the submount. Therefore, the flexibility of designing can be enhanced and the delivery time to the order from the customer can be shortened.

(2) Since the sealing member 255 has a thermal expansion coefficient nearly equal to that of support member 253 and the submounts 252a to 252p are disposed like islands in the support member 253, the respective submounts can flexibly move according to the thermal expansion or contraction of the sealing member 255 and support member 253 that have a thermal expansion coefficient greater than the submounts 252a to 252p. Therefore, even when the multiple LED elements are disposed, the stress due to temperature is equivalent to that in the case of single LED element. The stress between the LED element and submount does not occur. Further, the boundary separation etc. between the sealing member 255 and support member 253 does not occur.

(3) Since heat generated from the LED elements 254a to 254p is radiated through the submounts 252a to 252p to the support member 253, the heat radiation efficiency can be enhanced. Even when the LED elements 254a to 254p are of high-output type, the LED elements 254a to 254p, submount 252a to 252p, support member 253, sealing member 255 etc. are not subjected to a thermal damage. Thus, the heat resistance, weather resistance and durability can be enhanced.

(4) Because of using the multilayer substrate as the support member 253, an arbitrary circuit pattern can be formed without interfering with the heat radiation property.

Figure 22A:
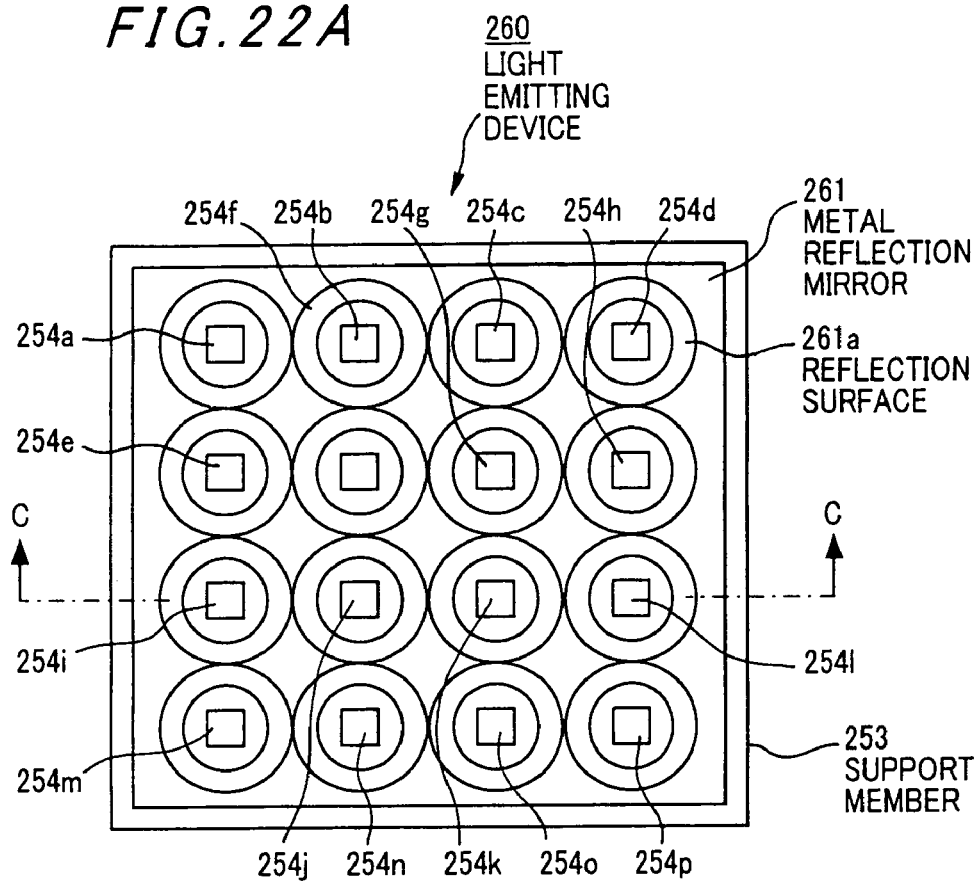
FIG. 22A is a plain view showing a light emitting device in a sixteenth preferred embodiment of the invention.
Figure 22B:
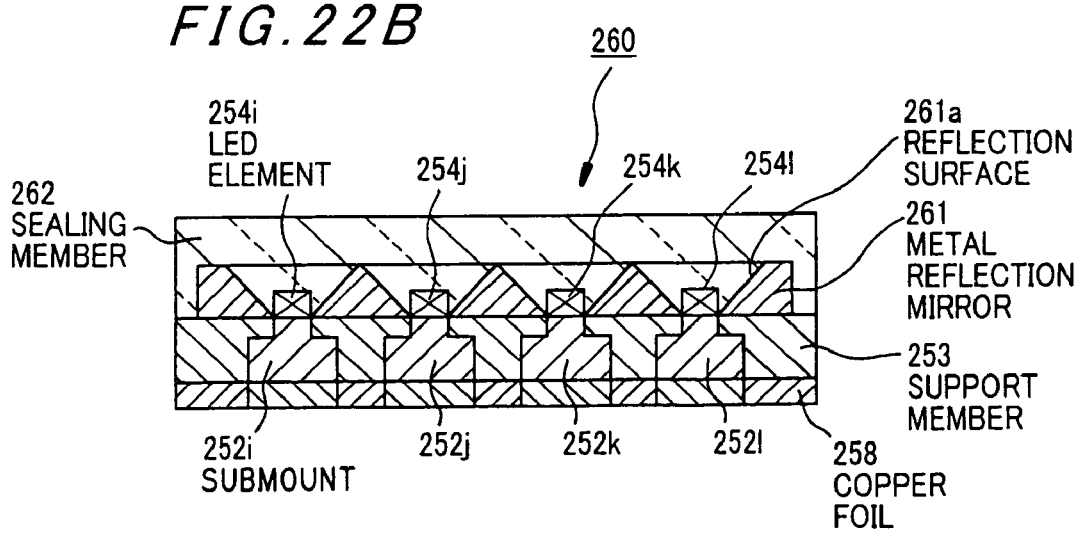
FIG. 22B is a cross sectional view cut along a line C-C in FIG. 22A.

FIG. 22A is a plain view showing a light emitting device in the sixteenth preferred embodiment of the invention. FIG. 22B is a cross sectional view cut along a line C-C in FIG. 22A.

The light emitting device 260 of the sixteenth embodiment is basically the same as the light emitting device 250 in FIGS. 21A and 21B. The difference is that a metal reflection mirror 261 to serve both as a second radiator and as a reflection mirror is provided on the support member 253 of glass-contained $Al_2O_3$. Like components are indicated by the same numerals used in the light emitting device 250 in FIGS. 21A and 21B. In FIGS. 22A and 22B, the metal base is not shown.

The metal reflection mirror 261 is of a copper material, and has sixteen concave portions that are made at predetermined intervals by pressing, sixteen reflection surfaces 261a are formed therein and the LED elements 254a to 254p are located at the center. The reflection surface 261a is formed by mirror-finishing the inner surface thereof with silver deposition, silver plating etc. or by conducting the white or silver surface treatment thereon. The reflection surface 261a is provided with a nickel plating base layer and with the silver deposition or plating only in the concave portion. The nickel plating has a good adhesion property to glass. Thereby, the separation can be prevented.

The metal reflection mirror 261 is bonded through oxide to the support member 253 by heat treatment at 900° C. A sealing member 262 with a predetermined height is formed on the sixteen reflection surfaces 261a and the metal reflection mirror 261. The sealing member 262 is of the same material and with the same property (thermal expansion coefficient etc.) as the sealing member 214 in the previous embodiment.

In addition to the effects of the thirteenth to fifteenth embodiments, the next effects are obtained by the sixteenth embodiment.

(1) Since the metal reflection mirror 261 with the sixteen reflection surfaces 261a corresponding to the LED elements 254a to 254p is disposed on the support member 253, light emitted from the LED elements 254a to 254p can be effectively taken out in a desired direction according to the shape of reflection faces 261a.

(2) Since the sealing member 262 has a thermal expansion coefficient nearly equal to that of support member 253 and the metal reflection mirror 261, the stress due to temperature does not occur even when the metal reflection mirror 261 is provided between the sealing member 262 and the support member 253, and the boundary separation etc. does not occur.

Figure 23:
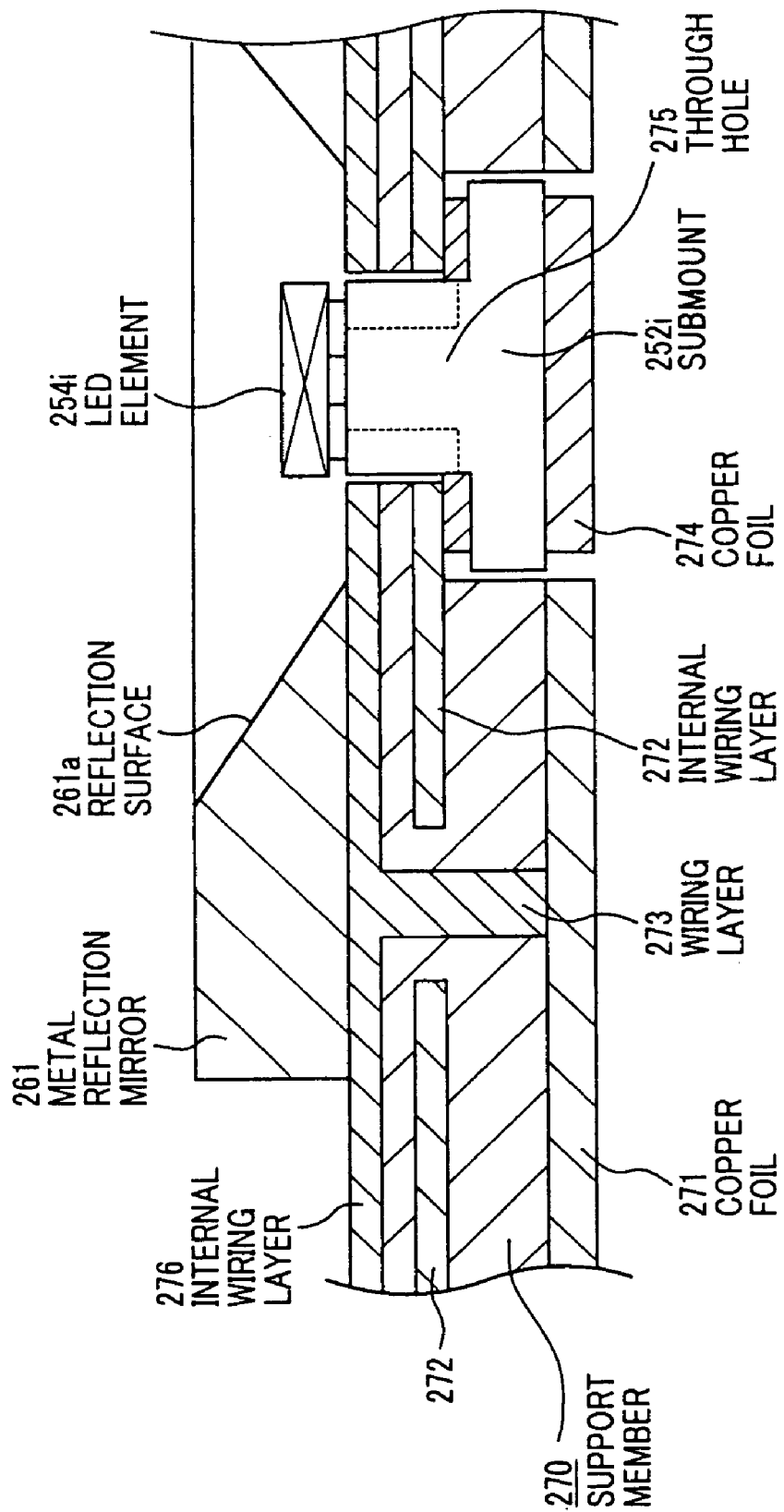
FIG. 23 is a cross sectional view showing a modification of a support member in the sixteenth embodiment.

FIG. 23 is a cross sectional view showing a modification of the support member in the sixteenth embodiment. In FIG. 23, only the vicinity of LED element 254i is shown and the other part is not shown.

The support member 270 is of a multilayer substrate with a wiring pattern formed stacked in the cross section. Copper foil layers 271, 276 are disposed on the lower and upper surfaces. An internal wiring layer 272 connected to the LED element 254i is disposed inside the support member 270. The internal wiring layer 272 is formed bypassing a wiring layer 273 for heat radiation. The wiring layer 273 is a radiation path connecting between the copper foil layers 271 and 276. The submount 252i is provided with a copper foil layer 274 formed on the bottom surface, and with a through hole 275 formed inside to connect between the electrode of LED element 254i and the internal wiring layer 272.

Thus, by forming the wiring layer 273 as a radiation path, heat generated from the LED element 254i can be easily conducted from the submount 251i through the copper foil layer 274, metal base (not show), copper foil layer 271, wiring layer 273, and copper foil layer 276 to the metal reflection mirror 261. Therefore, the heat radiation property can be enhanced.

Figure 24A:
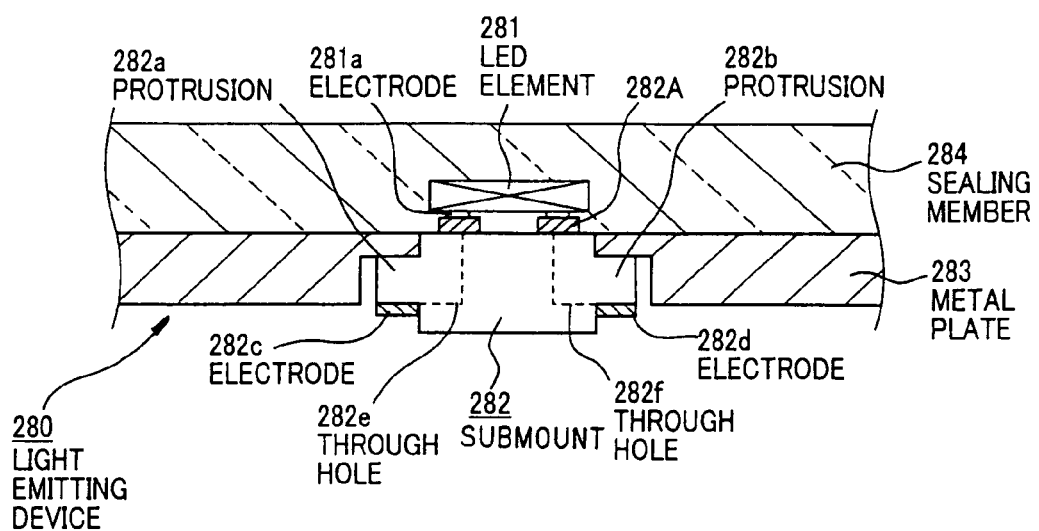
FIG. 24A is a cross sectional view showing a light emitting device in a seventeenth embodiment of the invention.
Figure 24B:
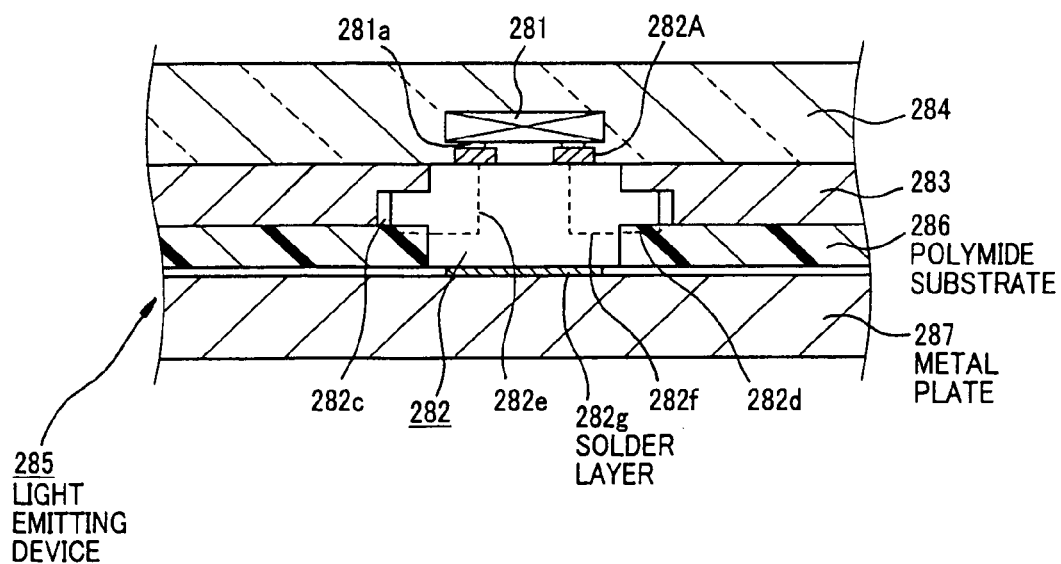
FIG. 24B is a cross sectional view showing a modification of the light emitting device in FIG. 24A.

FIG. 24A is a cross sectional view showing a light emitting device in the seventeenth embodiment of the invention. FIG. 24B is a cross sectional view showing a modification of the light emitting device in FIG. 24A.

The light emitting device 280 of the seventeenth embodiment is characterized in that a metal plate, a conductor is used as the support member whereas insulating materials are used as the support member in the preceding embodiments.

The light emitting device 280 is composed of: an LED element 281; a submount 282 that the LED element 281 is mounted on the top surface; a metal plate 283 that the submount 282 is inserted into its one penetrating hole; and a sealing member 284 that covers the surface of the LED element 281 and metal plate 283.

The LED element 281 and submount 282 are the same as the LED element 211 and submount 212 of the light emitting device 201. The submount 282 is provided with protrusions 282a, 282b on both sides at the middle level, and is mounted such that the upper surface of protrusions 282a, 282b contacts the step portion of penetrating hole. The protrusions 282a, 282b are provided with electrodes 282c, 282d attached at the lower surface. Through holes 282e, 282f are formed inside the submount 282 so as to connect between the electrodes 282c, 282d and the electrode (or solder bump) 281a of LED element 281. Also, an electrode 282A electrically connected with the electrode 281a is formed on the upper surface of submount 282. When power is supplied from a power source, it may be supplied directly to the electrodes 282c, 282d, or supplied thereto through a substrate.

The metal plate 283 serves as a radiator, and is of a material such as copper with a high thermal conductivity, and is provided with the step portion formed at the tip.

The sealing member 284 is of transparent low-melting glass like the sealing member 214 of light emitting device 201, and has a thermal expansion coefficient nearly equal to that of the metal plate 283 as a support member.

The process of fabricating the light emitting device 280 will be explained below.

At first, the submount 282 is inserted into the penetrating hole of metal plate 283 from the bottom side of FIG. 24A. Then, the LED element 281 is mounted on the top surface of submount 282. Then, by sealing it with the sealing member 284, the light emitting device 280 can be fabricated.

Alternatively, after the LED element 281 is mounted on the top surface of submount 282, the submount 282 maybe inserted into the penetrating hole of metal plate 283. A reflection mirror may be provided on the surface of metal plate 283.

In addition to the effects of the thirteenth and fourteenth embodiments, the seventeenth embodiment has the effect that the metal plate 283 serves as a radiator while serving as a support member to hold the submount 282. Therefore, a certain radiation effect can be obtained without using the metal base. Thus, the light emitting device can be low-profiled.

As described above, even in the composition as shown in FIG. 24A, a certain radiation effect can be obtained by the metal plate 283. However, if desired to increase the radiation property, as shown in FIG. 24B, a metal base of copper or aluminum may be added. The metal base 287 is, as shown in FIG. 24B, can be attached to the bottom surface of submount 282 by solder-bonding using a solder layer 282g provided on the bottom surface of submount 282. A polyimide substrate 286, insulating substrate is disposed under the metal plate 283. The polyimide substrate 286 is provided with an internal wiring layer (not shown) connected to the electrodes 282c, 282d.

Figure 25A:
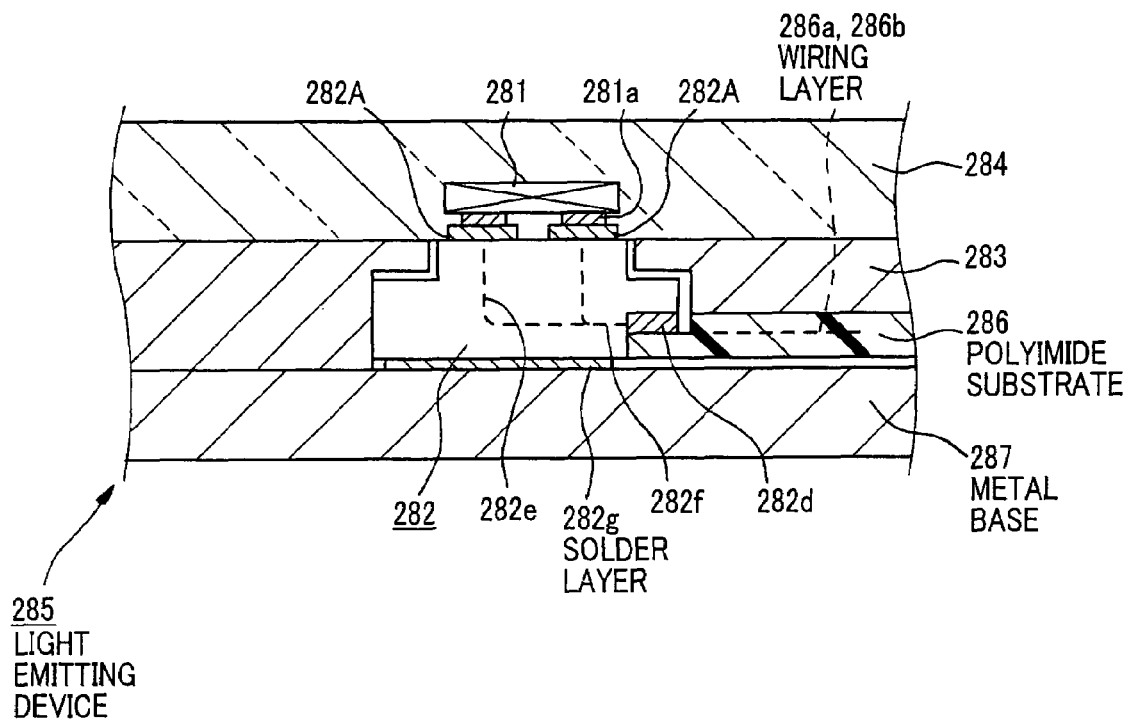
FIG. 25A is a cross sectional view showing another modification of the light emitting device in FIG. 24A.
Figure 25B:
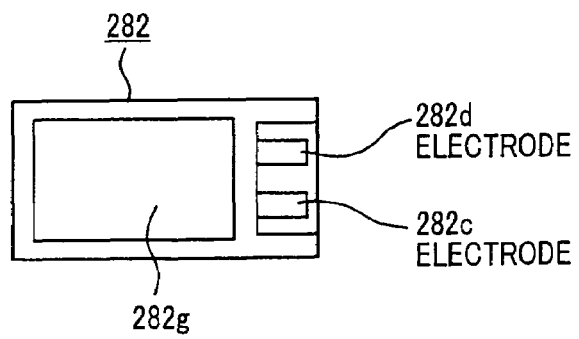
FIG. 25B is a bottom view showing a submount in FIG. 25A.

FIG. 25A is a cross sectional view showing another modification of the light emitting device in FIG. 24A. FIG. 25B is a bottom view showing a submount in FIG. 25A.

The polyimide substrate 286 is composed stacking a wiring layer 286a connected to the cathode electrode 282c and a wiring layer 286b connected to the anode electrode 282d. It is connected to one side of the submount 282.

Thus, a simple wiring is provided between the polyimide substrate 286 and the submount 282. Further, the other side of submount 282 not connected to the polyimide substrate 286 can be used as a radiation path to the metal base 287. Therefore, it can have a good heat extraction property.

Figure 26:
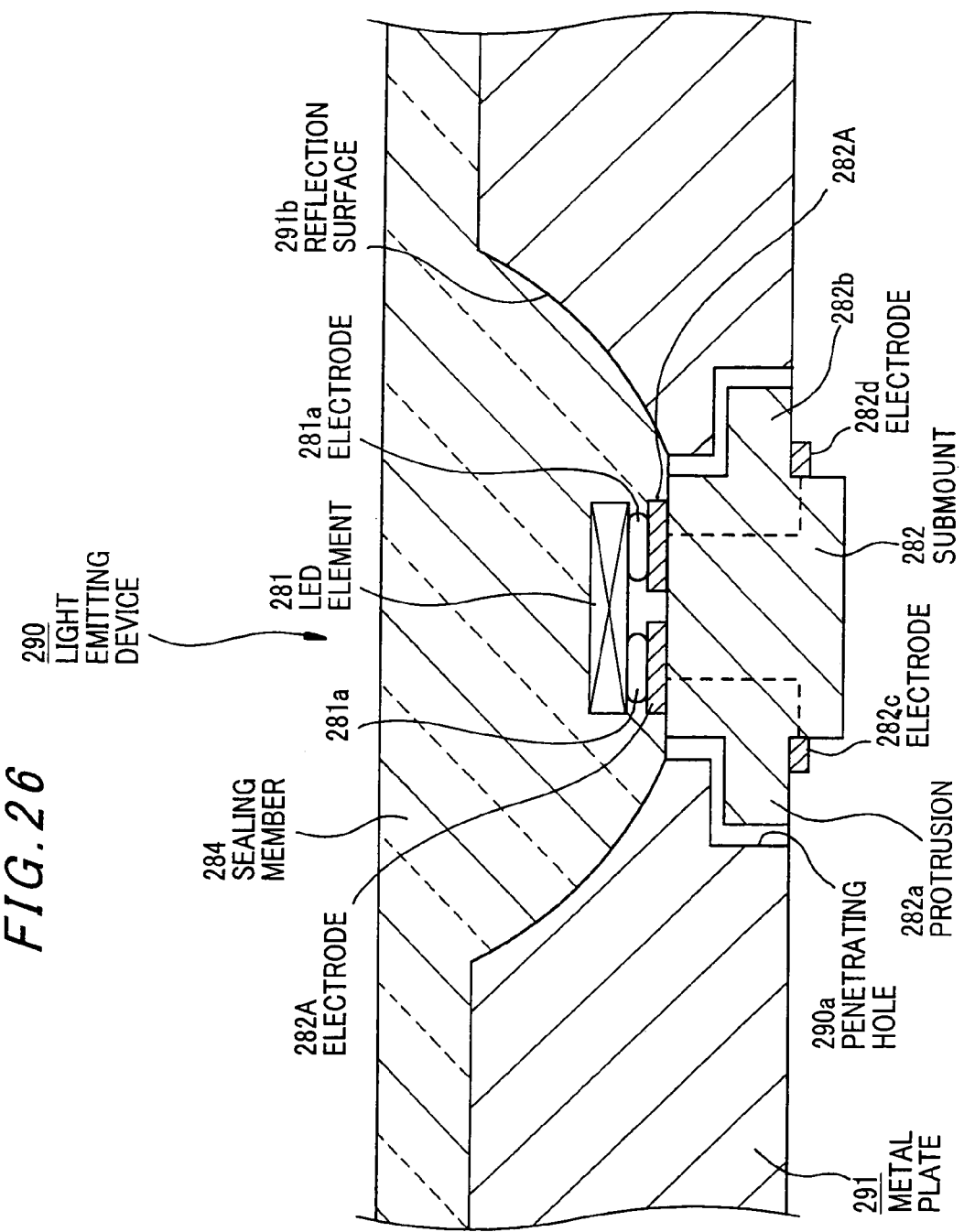
FIG. 26 is a cross sectional view showing a further modification of the light emitting device in FIG. 24A.

FIG. 26 is a cross sectional view showing a further modification of the light emitting device in FIG. 24A. In FIG. 26, like components are indicated by the same numerals used in FIG. 24A.

The light emitting device 290 uses a metal plate 291 formed increasing the thickness of metal plate 283 in FIG. 24A. The metal plate 291 is, at a predetermined position, provided with a penetrating hole 290a into which the submount 282 is inserted. The penetrating hole 290a is provided with a cone-shaped hollow concave portion on the upper side such that the bottom surface of concave portion is nearly at the same level as the top surface of submount 282. The concave portion is provided with a reflection surface 291b formed on the inner surface. The reflection surface 291b is formed by mirror-finishing with silver deposition, silver plating etc. or by conducting the silver or white coating etc. The sealing member 284 of low-melting glass is filled in the concave portion such that its predetermined thickness is given above the metal plate 291.

The submount 282 is, on the top surface, provided with the electrode 282A that is electrically connected through an internal wiring layer to the corresponding electrodes 282a and 282d.

The material of sealing member 284 is not limited to low-melting glass, and may be epoxy resin or silicone resin. Resins cannot have such a thermal expansion coefficient as metals like the low-melting glass, and, in fact, they have a thermal expansion coefficient several times that of metals. However, the amount of thermal expansion is not so much because the processing temperature of resin is lower than that of low-melting glass, and the metal plate 291 as support member does not have such a low thermal conductivity as the submount. Therefore, the separation or cracking can be prevented.

In addition to the effect of the sixteenth embodiment, the seventeenth embodiment has the effect that the light extraction efficiency can be enhanced because the metal plate 291 is provided with the reflection surface 291b. Further, because of the increased thickness of metal plate 291, the radiation resistance as a radiator can be reduced and thereby the radiation efficiency can be enhanced.

Figure 27:
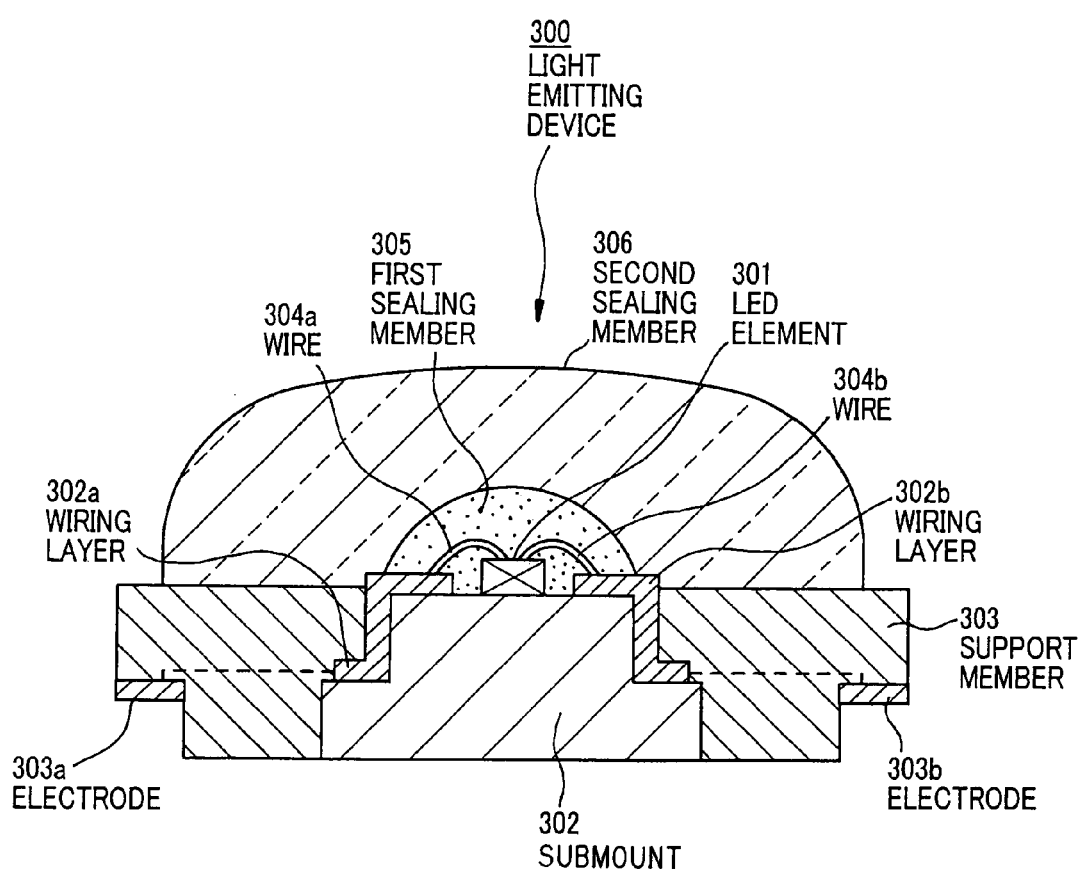
FIG. 27 is a cross sectional view showing a light emitting device in an eighteenth embodiment of the invention.

FIG. 27 is a cross sectional view showing a light emitting device in the eighteenth embodiment of the invention.

The eighteenth embodiment is characterized in that a face-up type LED element to be connected through wires to the current feeding side is used whereas the face-down type LED element is used in the above embodiments.

The light emitting device 300 is composed of: an LED element 301; a submount 302 that the LED element 301 is mounted thereon; a support member 303 to hold the submount 302; wires 304a, 304b that connect between wiring layers 302a, 302b of the submount 302 and electrodes (not shown) of the LED element 301; a first sealing member 305, as a heat-resisting member, that seals the LED element 301, wires 304a, 304b and its vicinity; and a second sealing member 306 that seals the upper exposed surface of the first sealing member 305 and support member 303.

The LED element 301 is of different type, but it is of the same semiconductor as the LED element 211. The submount 302 and support member 303 are of the same material and with the same thermal expansion coefficient as the submount 212 and support member 213. The support member 303 is provided with a penetrating hole into which the submount 302 is inserted, and with electrodes 303a, 303b at the lower surface of its protrusions. The electrodes 303a, 303b are connected through an internal wiring layer (shown by dotted lines) disposed inside the support member 303 to wiring layers 302a, 302b of the submount 302.

The wires 304a, 304b are of gold or aluminum. The wires 304a, 304b may be deformed or crushed when the sealing member 306 is filled thereinto. Therefore, in sealing the wires 304a, 304b, the first sealing member 305 is used that is a ceramic coat material with a thermal expansion coefficient between the submount 302 and the second sealing member 306. Thereby, the deformation or crush of wires 304a, 304b can be prevented. The second sealing member 306 to cover the first sealing member 305 has a thermal expansion coefficient nearly equal to that of the support member 303. Thereby, the occurrence of stress at the contact face to the other member can be prevented.

Although in FIG. 27 the exposed part of submount 302 from the support member 303 is shown significantly wider than the LED element 301, it only needs, in fact, to be a little widened to provide the wire boding space. It is desirable that the exposed part has an area twice or less the LED element 301. If the first sealing member 305 is of an elastic material or a buffer-effect member with a thermal expansion coefficient between the submount 302 and the second sealing member 306, the exposed part may be wider than that.

The process of fabricating the light emitting device 300 will be explained below.

At first, the submount 302 is inserted into the penetrating hole formed at a predetermined position from the bottom side of FIG. 27. The submount 302 has the wiring layers 302a, 302b formed thereon. Then, LED element 301 is, at a predetermined position, mounted on the submount 302. Then, the upper electrodes (not shown) of LED element 301 are bonded to wiring layers 302a, 302b through the wires 304a, 304b. The first sealing member 305 seals the LED element 301 while covering the wires 304a, 304b. Further, the second sealing member 306 seals the surface of the first sealing member 305 and support member 303.

In the eighteenth embodiment, because of using the double sealing members, the wires 304a, 304b can be protected from a pressure in sealing so as not to be subjected to deformation or crush. Thus, even when a face-up LED element 301 is used, the same effects as described in the above embodiments can be obtained.

Figure 28:
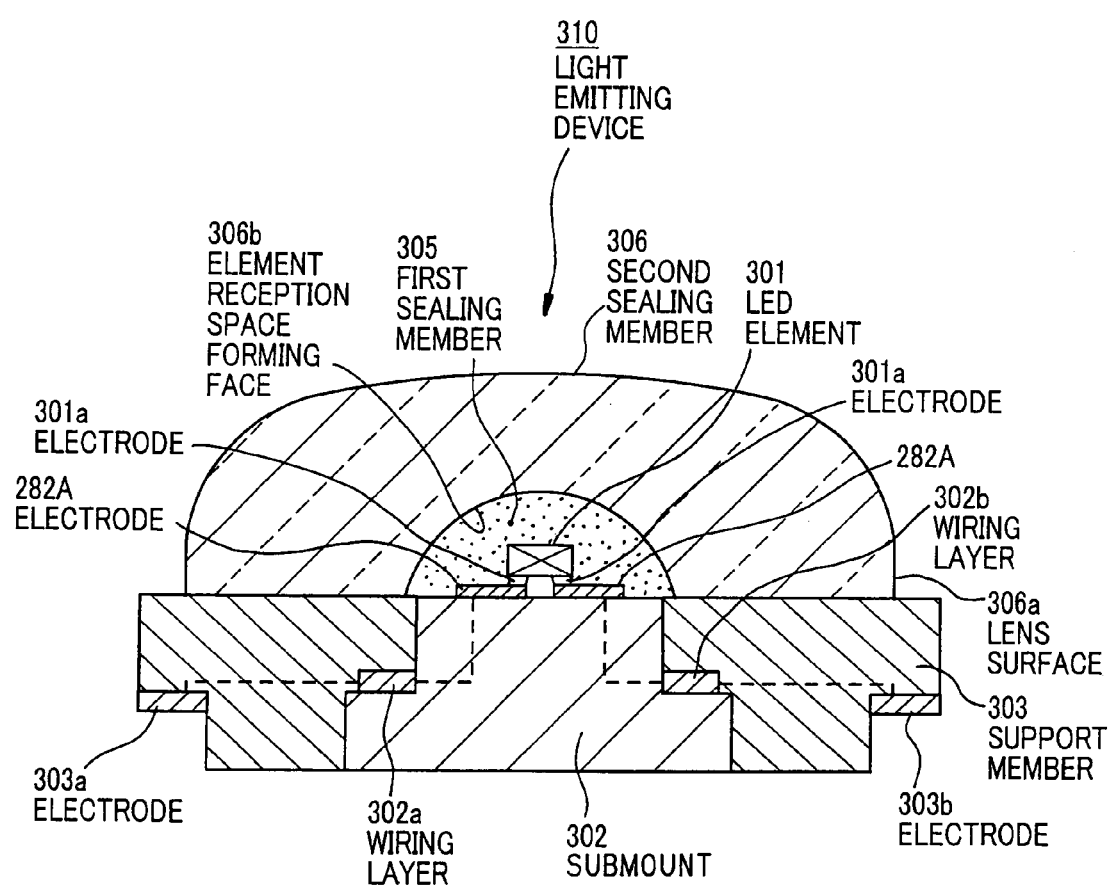
FIG. 28 is a cross sectional view showing a light emitting device in a nineteenth embodiment of the invention.

FIG. 28 is a cross sectional view showing a light emitting device in the nineteenth embodiment of the invention.

The light emitting device 310 of this embodiment is different from the light emitting device 300 of the eighteenth embodiment in that the first sealing member 305 is of silicone resin as elastic material, a face-down (flip-chip) type element is used and another fabrication process is used. Like components are indicated by the same numerals used in FIG. 27.

In fabricating the light emitting device 310, at first, the support member 303 is placed in a mold with a glass contact surface of platinum. This mold has a shape according to a convex recess to which the submount 302 is inserted and a semisphere shape according to the shape of an element reception space forming face 306b at part protruding from the upper surface of support member 303. Then, by heating low-melting glass, the second sealing member 306 is bonded and a lens surface 306a and the element reception space forming face 306b are formed. Then, silicone resin to form the first sealing member 305 is injected into the element reception space inside the element reception space forming face 306b and then is hardened. Then, the LED element 301 is mounted on the submount 302. Then, the submount 302 is inserted into the penetrating hole formed at a predetermined position of the support member 303, from the bottom of FIG. 28, and the support member 303 and the submount 302 are bonded using brazing filler metal. In this case, the silicone resin has elasticity and, therefore, can be deformed according to the surface shape of LED element 301 when pushing the LED element 301 thereinto, thereby sealing the LED element 301. In bonding the submount 302, a solder material can be used other than brazing filler metal.

The next effects are obtained by the nineteenth embodiment.

(1) By attaching the metal base to the bottom side in FIG. 28, the penetration of moisture etc. can be prevented like the fourteenth embodiment.

(2) Since the LED element 301 is not exposed to a high-temperature atmosphere in the processing of glass, even the LED element 301 with a low heat resistance can be applied. Other than the low-melting glass, glass with a higher melting point can be used.

(3) Since the first sealing member 305 is covered with second sealing member 306 of glass material, the shape of lens surface 306a can be kept. Pure silicone resin is little degraded due to heat or light, but additives for resin hardening cause a discoloration thereof. In the nineteenth embodiment, by using pure silicone resin oil as the first sealing member 305, the lowering of light output caused by the degradation due to heat or light can be prevented. Thereby, the reliability can be enhanced.

In the light emitting devices 201, 230, 250, 260, 280, 285, 290, 300 and 310, a phosphor layer for wavelength conversion can be disposed in the glass sealing portion. For example, when the LED element emits blue light, the phosphor layer may be of a phosphor such as Ce(cerium): YAG (yttrium-aluminum-garnet) with a property that yellow light is radiated therefrom while being excited by the blue light.

In the above embodiments, a radiation fin can be formed on or attached to the metal bases 215, 232, 251 and 287, the metal plates 283 and 290, and the metal reflection mirror 261. Thereby, the heat radiation effect can be further enhanced.

Although the sealing members 214, 235 are formed flat, they may be formed otherwise, e.g., lamp-shaped, diamond-cut etc.

Further, the invention is not limited to the light emitting devices and can be applied to a light emitting device such as a semiconductor device using a light-receiving element such as a solar battery. Since the sealing member is of glass, it does not degrade even when exposed to sunlight for long hours. A light emitting device as a solar battery can be offered that has a condenser lens and a downsized light-receiving element. By applying the invention thereto, the lowering of conversion efficiency due to temperature rise can be prevented, and the weather resistance and heat resistance etc. can be enhanced.

Although in the above embodiments the flip-chip type element uses the Au stud bump, the bump may be of a material other than Au or it may be replaced by a contact member other than the bump.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
    a light emitting element comprising a light emitting layer to emit light with a predetermined wavelength; and
    a sealing portion that seals the light emitting element, the sealing portion comprising a glass,
    wherein the light emitting element comprises a substrate comprising a stress reducing portion to reduce an internal stress in the sealing portion, the stress reducing portion being formed on an opposite side to a side where the light emitting layer is formed,
    the light emitting element is flip-chip mounted, and
    the stress reducing portion comprises an oblique portion formed between a top surface and a side surface of the substrate, the top surface and the side surface being substantially orthogonal to each other.

2. The light emitting device according to claim 1, wherein:
    the oblique portion comprises an obliquely-cut surface or a rounded surface.

3. The light emitting device according to claim 1, wherein:
    a refractive index of the substrate is approximately equal to a refractive index of the light emitting layer.

4. The light emitting device according to claim 1, wherein: the sealing portion comprises an optical shape to radiate the light in a predetermined direction.

5. The light emitting device according to claim 1, wherein: the sealing portion is integrated with by hot pressing a composite glass of at least two glass layers stacked.

6. The light emitting device according to claim 5, wherein: the composite glass includes a thin-film phosphor layer to be excited by the light between the at least two glass layers.

7. The light emitting device according to claim 5, wherein: the composite glass includes a phosphor complex-contained glass layer to contain a phosphor complex to be excited by the light.

8. A light emitting device, comprising:
a light emitting element;
a lead that is electrically connected to the light emitting element at its one end and serves as a terminal to supply a power source to the light emitting element;
a metal base that the light emitting element is mounted thereon and radiates heat of the light emitting element; and
a sealing member that comprises a transparent resin or glass and covers the light emitting element,
wherein a part of the lead is disposed parallel to the metal base to sandwich a heat-resisting insulating member between the lead and the metal base, and
the heat-resisting insulating member has a thermal expansion coefficient nearly equal to that of the metal base.

9. The light emitting element according to claim 8 further comprising:
a submount that makes a connection to the light emitting element and the lead through an electrode or a wiring layer,
wherein the light emitting element is mounted on the metal base through the submount.

10. The light emitting element according to claim 8, wherein:
the heat-resisting insulating member comprises a glass, and
the lead comprises a metal plate.

11. The light emitting element according to claim 8, wherein:
the heat-resisting insulating member comprises a ceramics, and
the lead comprises a metal pattern formed on the heat-resisting insulating member.

12. The light emitting element according to claim 8 further comprising:
a metal reflection mirror portion that is stacked on the metal base or integrated with the metal base.

13. The light emitting element according to claim 8, wherein:
the metal base comprises a radiation fin.

14. The light emitting element according to claim 12, wherein:
at least one of the metal base and the metal reflection mirror comprises a radiation fin.

15. The light emitting element according to claim 8, wherein:
the metal base comprises a sheet heat sink.

16. A light emitting device, comprising:
an optical element;
a submount that the optical element is mounted thereon and comprises a thermal expansion coefficient nearly equal to that of the optical element;
a support member that comprises a hole into which the submount is inserted, and comprises a thermal expansion coefficient greater than that of the submount; and
a transparent sealing member that seals the optical element and is transparent to a targeted wavelength,
wherein the submount is disposed such that its surface to mount the optical element is exposed from the hole on the side of the sealing member, and is bonded to the support member and the transparent sealing member to seal the optical element, and
the support member comprises ceramics.

17. The light emitting device according to claim 16, wherein:
the transparent sealing member comprises glass.

18. The light emitting device according to claim 16, wherein:
the support member comprises a thermal expansion coefficient nearly equal to that of the transparent sealing member.

19. The light emitting device according to claim 16, wherein:
the submount comprises a thermal conductivity coefficient of 100 or more $W \cdot m^{-1} \cdot k^{-1}$.

20. The light emitting device according to claim 16, wherein:
the submount comprises a convex shape in cross section that can be concave-convex fitted with the support member.

21. The light emitting device according to claim 16, wherein:
the submount comprises the surface to mount the optical element with an area nearly equal to that of the optical element.

22. The light emitting device according to claim 16, wherein:
the support member and the transparent sealing member comprise a thermal expansion coefficient of 10 to $20 \times 10^{-6}/^\circ C$.

23. The light emitting device according to claim 16, wherein:
the support member comprises a glass-contained $Al_2O_3$.

24. The light emitting device according to claim 16, wherein:
the support member comprises a multilayer substrate that a wiring pattern is formed in its cross section.

25. The light emitting device according to claim 16, wherein:
the optical element comprises a light emitting element.

26. The light emitting device according to claim 25, wherein:
the light emitting element is flip-chip bonded.

27. The light emitting device according to claim 25, wherein:
the light emitting element comprises a face-up type light emitting element and is covered with a heat resisting material while being electrically connected with a wire.

28. The light emitting device according to claim 16, wherein:
the submount comprises a radiation portion at its bottom.

* * * * *